(12) United States Patent
Unno et al.

(10) Patent No.: US 7,262,920 B2
(45) Date of Patent: Aug. 28, 2007

(54) OPTICAL ELEMENT AND MANUFACTURING METHOD THEREFOR

(75) Inventors: Yasuyuki Unno, Tochigi (JP); Seiji Takeuchi, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 819 days.

(21) Appl. No.: 10/684,294

(22) Filed: Oct. 10, 2003

(65) Prior Publication Data

US 2004/0136084 A1    Jul. 15, 2004

Related U.S. Application Data

(62) Division of application No. 09/934,947, filed on Aug. 22, 2001, now Pat. No. 7,102,828.

(30) Foreign Application Priority Data

Jun. 27, 2001  (JP) .............................. 2001-234254
Jul. 6, 2001   (JP) .............................. 2001/244970

(51) Int. Cl.
 *G02B 3/00* (2006.01)
(52) U.S. Cl. ...................... 359/649; 359/350; 359/355; 359/487; 359/488; 359/494; 359/500; 117/918; 117/940
(58) Field of Classification Search ................ 359/350, 359/355, 487, 488, 494, 500, 649; 117/918, 117/940
See application file for complete search history.

(56) References Cited

U.S. PATENT DOCUMENTS

| 2,934,993 | A | 5/1960 | Chromy |
| 3,904,267 | A | 9/1975 | de Veer |
| 4,215,288 | A | 7/1980 | Kato et al. |
| 5,042,922 | A | 8/1991 | Pepper |
| 5,100,237 | A | 3/1992 | Wittekoek et al. |
| 5,795,047 | A | 8/1998 | Sannohe et al. |
| 5,867,315 | A | 2/1999 | Koike et al. |
| 6,201,634 | B1 | 3/2001 | Sakuma et al. |
| 6,330,256 | B1 | 12/2001 | Byren et al. |
| 6,424,471 | B1 | 7/2002 | Ulrich et al. |
| 6,518,210 | B1 | 2/2003 | Jinbo et al. |
| 6,788,389 | B2 * | 9/2004 | Fujishima et al. ............ 355/67 |

(Continued)

FOREIGN PATENT DOCUMENTS

EP    0 942 297 A2    9/1999

(Continued)

OTHER PUBLICATIONS

An Office Action from the Taiwanese Patent Office issued on Apr. 11, 2005 for Appl. No. 091,108,576.

(Continued)

*Primary Examiner*—Hung Dang
*Assistant Examiner*—Joseph Martinez
(74) *Attorney, Agent, or Firm*—Morgan & Finnegan, LLP

(57) ABSTRACT

An optical element and a manufacturing method therefor, an exposure apparatus, and a device manufacturing method that can reduce the effect of intrinsic birefringence under high NA conditions. According to an optical element as one aspect of the present invention, an angle between a [0 0 1] axis of an isometric crystal and an optical axis is less than 10°, and preferably 0°.

7 Claims, 18 Drawing Sheets

U.S. PATENT DOCUMENTS

| | | |
|---|---|---|
| 2002/0011893 A1 | 1/2002 | Takai |
| 2002/0036832 A1 | 3/2002 | Schultz et al. |
| 2002/0118464 A1 | 8/2002 | Nishioka et al. |
| 2002/0149855 A1 | 10/2002 | Schuster |
| 2003/0007253 A1 | 1/2003 | Schuster et al. |
| 2003/0011893 A1 | 1/2003 | Shiraishi et al. |
| 2003/0011896 A1 | 1/2003 | Shiraishi |
| 2003/0030917 A1 | 2/2003 | Omura |
| 2003/0067679 A1 | 4/2003 | Allan et al. |
| 2003/0086071 A1 | 5/2003 | McGuire, Jr. |
| 2003/0086156 A1 | 5/2003 | McGuire, Jr. |
| 2003/0086157 A1 | 5/2003 | McGuire, Jr. |
| 2003/0086171 A1 | 5/2003 | McGuire |
| 2003/0099047 A1 | 5/2003 | Hoffman et al. |
| 2004/0001244 A1 | 1/2004 | Hoffman et al. |

FOREIGN PATENT DOCUMENTS

| | | |
|---|---|---|
| EP | 0 942 297 A3 | 9/1999 |
| EP | 0942297 A2 | 9/1999 |
| JP | 05-27200 | 2/1993 |
| JP | 11-054411 | 2/1999 |
| JP | 11-326189 | 11/1999 |
| JP | 2000-086394 | 3/2000 |
| JP | 2000-089450 | 3/2000 |
| JP | 2000-128696 | 5/2000 |
| JP | 2000-331927 | 11/2000 |
| WO | 01/02799 | 1/2001 |
| WO | 03/38479 | 5/2003 |
| WO | 02/099500 | 12/2003 |

OTHER PUBLICATIONS

English translation of the Taiwanese Office Action issued on Apr. 11, 2005 for Appl. No. 091,108,576.
A Communication from European Patent Office for Appl. No. 02 736 104.7 -2217 dated Jul. 8, 2005.
International Search Report dated Jan. 10, 2003.
Written Opinion dated Mar. 24, 2003.
Invitation to pay additional fees dated Oct. 16, 2002.
Invitation to restrict dated Feb. 11, 2003.
Notification of transmittal of the international search report dated Jan. 23, 2003.
Communication dated Apr. 6, 2004 for Application No. 02 736 104.7-2217.
English abstract for JP05-27200.
English abstract for JP2000-86394.
English abstract for JP2000-128696.
English abstract for JP11-326189.
English abstract for JP11-054411.
English abstract for JP2000-089450.
English abstract for JP2000-331927.
US 6,538,822, 03/2003, Schuster (withdrawn)

* cited by examiner

OPTICAL ELEMENT AND MANUFACTURING METHOD THEREFOR

This is divisional continuation-in-part of application Ser. No. 09/934,947, filed Aug. 22, 2001 now U.S. Pat. No. 7,102,828.

BACKGROUND OF THE INVENTION

This invention relates generally to an optical element, and more particularly to optical elements consisting of an isometric crystal such as calcium fluoride ($CaF_2$), barium fluoride ($BaF_2$), and strontium fluoride ($SrF_2$), which elements are used in the short wavelength range from vacuum ultraviolet radiation to deep ultraviolet radiation, and a manufacturing method therefor.

The demand for finer semiconductor devices mounted in electronic apparatuses increases more and more as the need for smaller and thinner electronic apparatuses grows in recent years, and in order to fulfill the demand, various proposals for higher exposure resolution have been made. Since shortened wavelength of an exposure light source would serve as an effective means for achieving higher resolution, an ArF excimer laser (approximately 193 nm in wavelength) has been replacing a KrF excimer laser (approximately 248 nm in wavelength) for the exposure light source in recent years, and an $F_2$ excimer laser (approximately 157 nm in wavelength) has become commercially practical. The calcium fluoride ($CaF_2$) single crystal is most suitably used as an optical material for optical elements such as lenses and diffraction gratings for use with an exposure optical system in that light transmittance (i.e., internal transmittance) in the above wavelength range is high. In addition, the barium fluoride ($BaF_2$) single crystal and strontium fluoride ($SrF_2$) single crystal are also high in transmittance, thus their application has been under consideration.

The calcium fluoride ($CaF_2$) single crystal has been manufactured up to this time by the crucible descent method (also known as "Bridgman method"). In this method, materials for crystalline substances are filled in a crucible, melted by application of heat using a heater, and cooled by lowering the materials in the crucible, whereby the materials are crystallized. In this process a seed crystal having a desired face orientation to induce growth of a crystal is placed at a bottom of the crucible, so that the face orientation of the crystal to be grown is controlled. The calcium fluoride is generally advantageous in easy handling of cleavage plane of a <1 1 1> face perpendicular to the crystal orientation [1 1 1] axis, and further in less effect of birefringence due to photoelasticity with respect to light beams incident from a direction of the [1 1 1] axis. During the manufacturing process, the calcium fluoride grows to form a desired optical element under control of the face orientation using the seed crystal oriented to the <1 1 1> face, or by slicing the <1 1 1> face of the crystal, and thereby the optical element having a light beam incident surface at the <1 1 1> face is obtained. Consequently, an optical system constituted of the above optical element has an optical axis identical with the [1 1 1] axis, to contribute to improved optical properties of the optical element (or optical system).

However, even if an ideal calcium fluoride crystal without stress strain could grow, the use of a light beam with shorter wavelength would make potential birefringence (intrinsic birefringence) non-negligible, and the intrinsic birefringence would disadvantageously deteriorate the optical properties of the optical element and thus of the image-forming quality of the exposure apparatus. These disadvantages came into focus by Burnett, et al.'s report in the 2nd International Symposium on 157 nm Lithography held in Dana Point, Calif. in May 2001. Referring to their experimental results, the maximum value of the intrinsic birefringence of the calcium fluoride is 6.5 nm/cm with the wavelength of 157 nm, and the directions in which the maximum value is exhibited are twelve directions including an [1 1 0] axis direction. In the conventional exposure apparatuses, or projection optical systems in particular, the above-described optical element using the <1 1 1> face has an optical axis identical with the [1 1 1] axis, which is only 35.26 degrees apart from the [1 1 0] axis exhibiting the maximum birefringence. For example, the numerical aperture (NA) of the calcium fluoride for a beam passing along the [1 1 0] axis is 0.87 with the wavelength of 193 nm, and 0.90 with the wavelength 157 nm. Particularly, exposure apparatuses in recent years have been required to achieve improvement in resolution and thus tend to include a projection optical system with increased NA, and the NA ranging between 0.65 and 0.80 has become the mainstream. Accordingly, in the optical element of the projection optical system near wafer where the maximum angle of a light beam becomes the greatest, the light beam passes through an area near the [1 1 0] axis where the intrinsic birefringence represents a large value. This makes it difficult for the conventional exposure apparatuses to perform exposure of good image-forming quality.

SUMMARY OF THE INVENTION

Therefore, it is an exemplified object of the present invention to provide an optical element and manufacturing method therefor, exposure apparatus, and device manufacturing method that can lessen the effect of the intrinsic birefringence under high NA conditions.

Although a description will hereinafter be given with respect to the calcium fluoride, the same may apply to the barium fluoride and strontium fluoride that are isometric crystals having the same crystalline properties.

An optical element as one aspect of the present invention is such that an angle between a [0 0 1] axis of an isometric crystal and an optical axis is less than 10°, and preferably 0°.

According to another aspect of the present invention, there is provided an optical element in which an angle between a [0 0 1] axis of an isometric crystal and an optical axis of an optical system using the optical element is less than 10°, and preferably 0°.

According to the above optical element, wherein the angle between the [0 0 1] axis of an isometric crystal and the optical axis is less than 10°, the intrinsic birefringence represents the largest value when the ray is tilted at 45° from the [0 0 1] axis. Therefore, comparing an embodiment in which the optical axis is made identical with a [1 1 1] axis with another embodiment in which the optical axis is made identical with the [0 0 1] axis, the ray angle at which the intrinsic birefringence represents the maximum value may be greater when the optical axis is made identical with the [0 0 1] axis. Consequently, the optical element using <0 0 1> face, i.e., optical element in which the optical axis is made identical with the [0 0 1] axis may be less susceptible to deterioration of image-forming quality under high NA conditions. In addition, when the optical axis is made identical with the [0 0 1] axis, the ray angle of the maximum intrinsic birefringence is larger than the critical angle. This may prevent the birefringence from being the maximum even under high NA conditions when a light-emitting surface of the optical element is flat. The inventive optical element does not require the optical axis of light beams to be strictly identical with the [0 0 1] axis. However, the optical element needs to make an angle between the optical axis and the [0 0 1] axis at least less than 10°. This may prevent a relationship between the intrinsic birefringence quantities and the ray angle in the crystal from being substantially the same as in the conventional embodiment in which the optical axis is made identical with the [1 1 1] axis. Moreover, the above angle may prevent the maximum value of the intrinsic birefringence from being within the critical angle. The critical angle is an index used when a surface at the light emitting side is nearly flat.

Further, a manufacturing method for an optical element as another aspect of the present invention comprises the steps of growing an isometric crystal and forming the optical element from the isometric crystal that has been grown, and the above growing step includes the step of controlling growth so that a face orientation of the growing crystal is a <0 0 1> face. Alternatively, the manufacturing method comprises the steps of growing an isometric crystal and forming the optical element from the isometric crystal that has been grown, and the above forming step is performed by slicing the isometric crystal that has been grown with respect to a <0 0 1> face. According to these manufacturing methods for an optical element, an optical element in which the optical axis of light beams is identical with the [0 0 1] axis of the calcium fluoride may be manufactured, and thus an optical element having excellent optical properties may be provided. These manufacturing methods for an optical element are suitably applicable to manufacture of the above-described optical elements.

According to another aspect of the present invention, there is provided an optical element that is manufactured by the above manufacturing methods. The optical element manufactured by the above manufacturing methods has the same action as the optical element as described above. In the optical element, an angle between the [0 0 1] axis of an isometric crystal and an optical axis of the optical element is preferably less than 10°.

In the optical element as described above, the isometric crystal is calcium fluoride, barium fluoride, or strontium fluoride.

According to another aspect of the present invention, there is provided a projection optical system including any one of the optical elements as described above. This projection optical system includes the above optical element, and thus has the same action as described above. Therefore, the projection optical system may achieve an improved image-forming quality.

Further, according to a demagnification projection optical system as another aspect of the present invention, an optical component at an image side includes any one of the optical elements as described above. The demagnification projection optical system has the same action as the above optical element, and since the largest NA would be represented at the image side in the demagnification projection optical system, the application of the present invention to the optical component may improve the image-forming quality.

Moreover, according to a projection optical system as another aspect of the present invention, an optical component having a maximum angle between a light beam and an optical axis of 25° or greater includes any one of the optical elements, and. This projection optical system includes the above optical element, thus has the same action as described above, and is suitably applicable to an projection optical system having a ray angle at 25° or greater, i.e., NA of 0.65 or larger.

Moreover, according to another aspect of the present invention, there is provided a projection optical system including the optical element as described above, and a [0 1 0] axis perpendicular to the [0 0 1] axis is deviated from a characteristic direction of a pattern of a projected object at 10° or greater. This projection optical system may allow the direction in which the maximum value of the intrinsic birefringence around the optical axis in the optical element to be deviated from the characteristic direction of the pattern of the object, and thus achieve the image-forming quality. The characteristic direction of the object forms an angle of 0°, 45°, or 90° with respect to another direction of the object.

Moreover, according to another aspect of the present invention, there is provided a projection optical system including more than one of the optical elements as described above, the number of which is n, wherein the optical elements are located with one displaced from another around the optical axis so that a [0 1 0] axis perpendicular to the [0 0 1] axis of one of the optical elements and a [0 1 0] axis perpendicular to the [0 0 1] axis of another of the optical elements form an angle within 90/n±10° with each other. This projection optical system may achieve an excellent image-forming quality by displacing the directions in which the intrinsic birefringence represents the maximum value around the optical axis in the optical elements, the number of which is 2 or larger.

Further, according to another aspect of the present invention, there is provided an optical system including at least one optical element having intrinsic birefringence, wherein the birefringence in the optical system for all pencils of light contributing image forming satisfies b<$\lambda$/4, where b denotes wavefront deviation caused by birefringence (unit: nm), and $\lambda$ denotes a wavelength in use (unit: nm). This optical system is excellent in image-forming qualities because the relationship between an axis with respect to a crystal orientation of an isometric crystal and an optical axis makes the intrinsic birefringence of the optical system in entirety less than $\lambda$/4. This birefringence b may include birefringence by stress, while the stress birefringence is substantially zero, and the intrinsic birefringence is less than $\lambda$/4. The above birefringence (wavefront deviation) b may also satisfy b<$\lambda$/10. The above birefringence n may further satisfy b<$\lambda$/20. Each optical element as described above consists of an isometric crystal, and a relationship between an axis in a crystal orientation of the optical element and an optical axis is so configured that the intrinsic birefringence of the optical system is $\lambda$/4 or less, and preferably $\lambda$/10 or less. A projection optical system including the optical system as described above may also work as part of the present invention.

Further an optical system as another aspect of the present invention includes a plurality of optical elements in which an angle between a [1 1 0] axis of an isometric crystal and an optical axis is less than 10°, and preferably 0°, and one axis of more than one of the optical elements perpendicular to the [1 1 0] axis has a relative angle different from each other. This optical system may delay (or advance) a phase of a polarized component that has advanced (or delayed) in one optical element by using another optical element in which one axis perpendicular to the [1 1 0] axis has a relative angle different from that of the former optical element, thus canceling the phase difference between the polarized components and reducing the effect of the intrinsic birefringence. The more than one of the optical elements is substitutive for an optical component derived from division of the optical elements in a plane perpendicular to the [1 1 0] axis. When the optical system includes two of the optical elements, a relative angle of axes of the two optical elements perpendicular to the [1 1 0] axis is 90°. The two optical elements may be parallel flat plates that are equal in thickness to each other or lenses that are equal in thickness to each other. Characteristically, the isometric crystal in the above optical system may be fluoride. The isometric crystal may typically be calcium fluoride, barium fluoride, or strontium fluoride.

Further, a projection optical system as another aspect of the present invention includes an optical system that includes more than one of the optical elements in which each optical axis is identical with the [1 1 0] axis. Moreover, a demagnification projection optical system as another aspect of the present invention, and more than one of the optical elements at an image side in which an angle of marginal rays passing through the optical element forms an angle of 24.6° or greater includes any one of the optical elements as described above. This projection optical system includes the above optical element, and thus have the same action as described above. The optical elements other than the two or more of prescribed optical elements in the above projection optical system have the crystal orientation such that the angle between a [1 1 1] axis and an optical axis is less than 100. Also the optical elements other than the two or more of prescribed optical elements in the above projection optical system have the crystal orientation such that the angle between a [0 0 1] axis and an optical axis is less than 10°. Alternatively, the optical elements other than the two or more of prescribed optical elements in the above projection optical system have the crystal orientation such that the angle between a [1 1 1] axis or [0 0 1] axis and an optical axis is less than 10°. The projection optical system may include more than one of the optical elements as described above, forming a first set of optical elements, wherein a second set of optical elements within the first set of optical elements have the [0 0 1] axis substantially parallel with each other, wherein the rest of the first set of optical elements, forming a third set of optical elements, have the [0 0 1] axis substantially parallel with each other and perpendicular to the [0 0 1] axis of the second set of optical elements, and wherein a difference between a total thickness (element thickness on axis) of the second set of optical elements and a total thickness of the third set of optical elements is less than 10 mm. In this optical system, typically, a relative angle of axes perpendicular to the optical axis of the optical elements other than two or more of prescribed optical elements in the projection optical system may be changed to reduce intrinsic birefringence.

The above optical system may use a light source of which the wavelength is 200 nm or shorter. The light source may be an ArF excimer laser or an $F_2$ excimer laser.

Further, according to another aspect of the present invention, there is provided an optical element and optical system as described above, wherein an optical element as another aspect of the present invention is a lens, a diffraction grating, a parallel flat plate, an optical film, or a combination thereof. This optical element may have the same action as the above optical elements.

Further, an exposure apparatus uses ultraviolet radiation, deep ultraviolet radiation, and vacuum ultraviolet radiation as exposure light, which is projected onto an object to be processed through the above optical system, and exposes the object to be processed to light. This exposure apparatus includes the above optical element, and thus may achieve excellence in image-forming quality upon exposure to light.

Further, a device manufacturing method as another aspect of the present invention comprises the steps of projecting the light for exposure onto the object to be processed using the above exposure apparatus, and performing a predetermined process against the object to be processed to which the light has been projected and exposed. This device manufacturing method has the same action as the above exposure apparatus. The device manufacturing method and a device as a result of manufacture works as one aspect of the present invention.

Other objects and further features of the present invention will become readily apparent from the following description of the embodiments with reference to accompanying drawings.

DETAILED DESCRIPTION OF THE PREFERRED EMBODIMENTS

Observations on crystal orientation of isometric crystals and thorough considerations of intrinsic birefringence carried out by the inventors have revealed that an optical axis made identical with a [0 0 1] axis rather than the conventional optical axis made identical with a [1 1 1] axis could reduce the effect of the intrinsic birefringence. Although a description will be given using calcium fluoride ($CaF_2$) as the isometric crystal for illustration purposes, usable substances are not limited thereto. The same may apply to the barium fluoride and strontium fluoride that are isometric crystals having the same crystalline properties.

Figure 1:
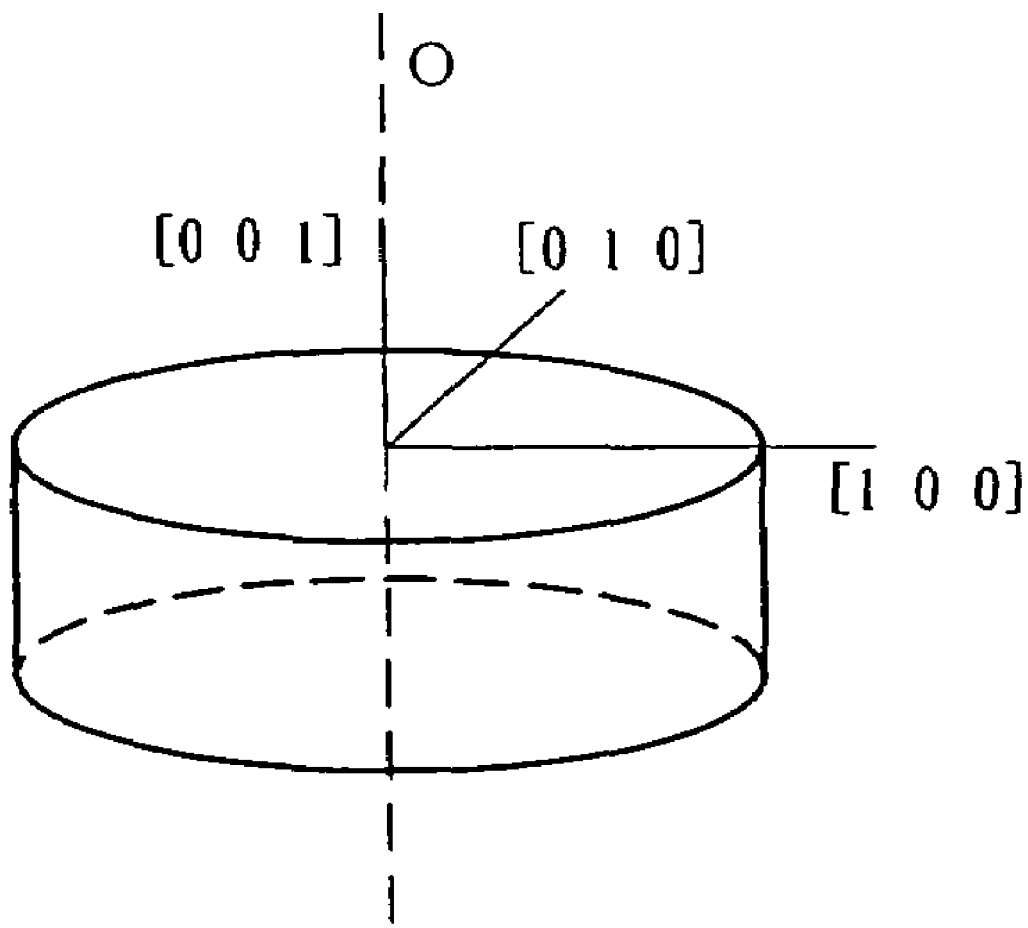
FIG. 1 is a schematic illustration of an optical element of the present invention.
Figure 2:
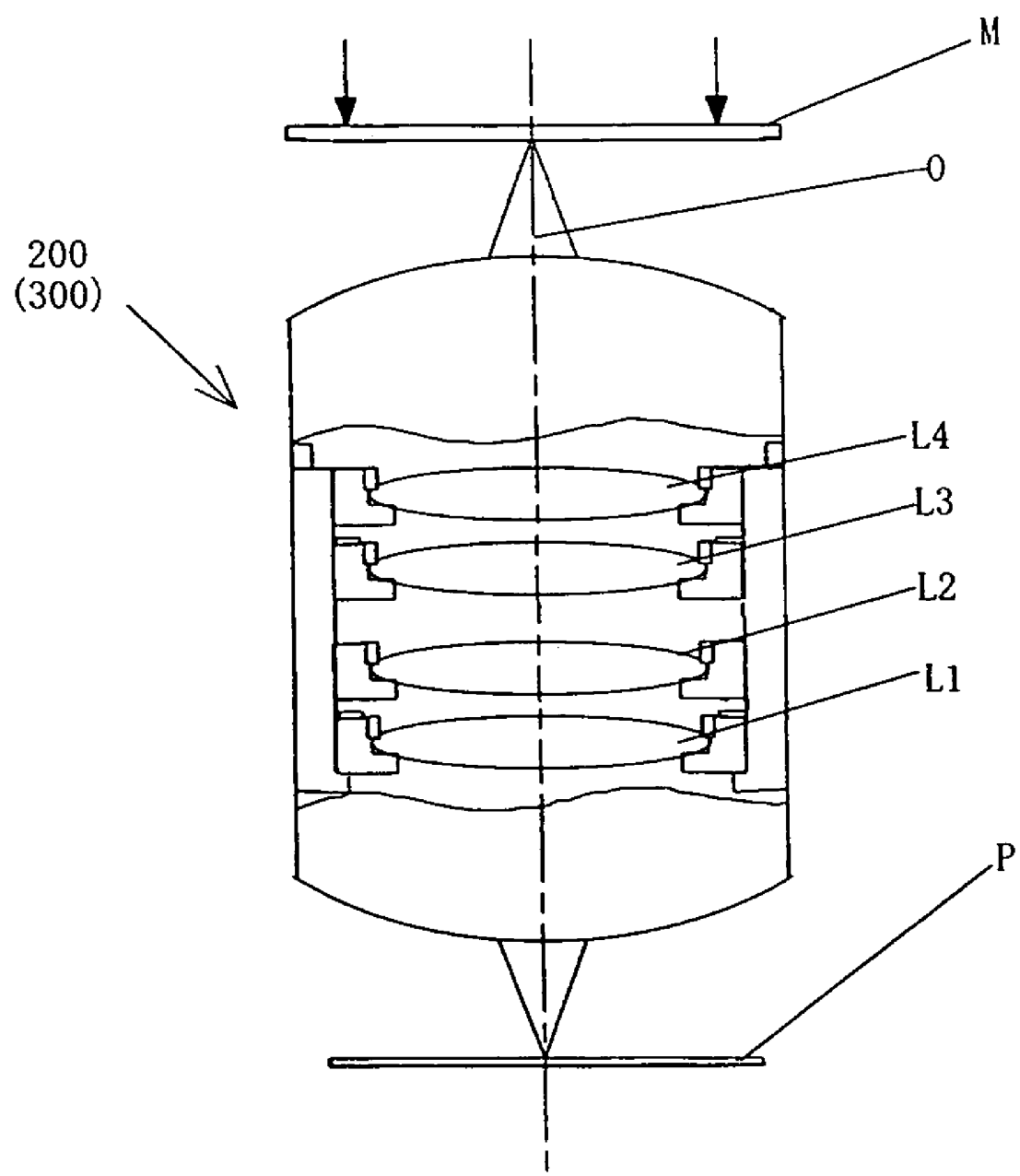
FIG. 2 is a schematic side view of a projection optical system to which the optical element as shown in FIG. 1 is applied.
Figure 3:
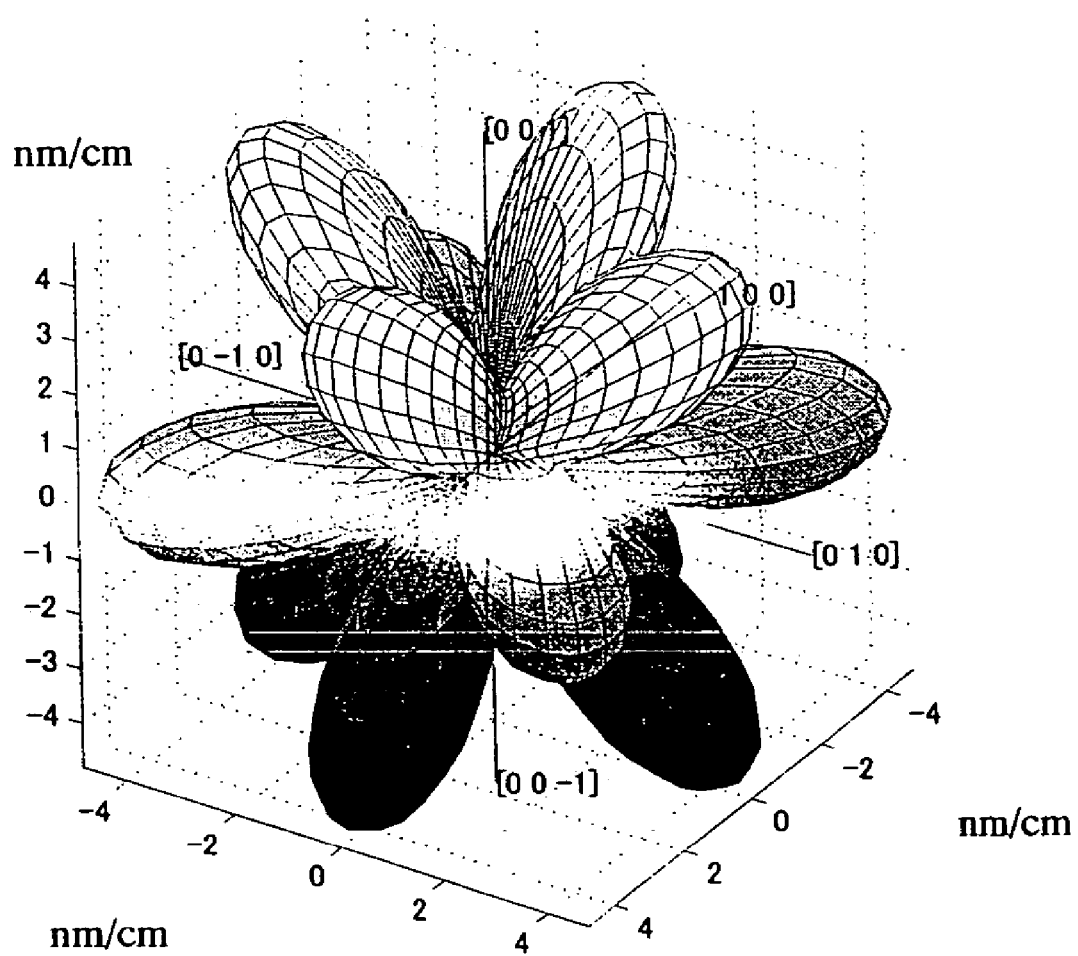
FIG. 3 shows a result of simulation in which intrinsic birefringence of calcium fluoride and orientations thereof with the wavelength of 157 nm are three-dimensionally illustrated.
Figure 4:
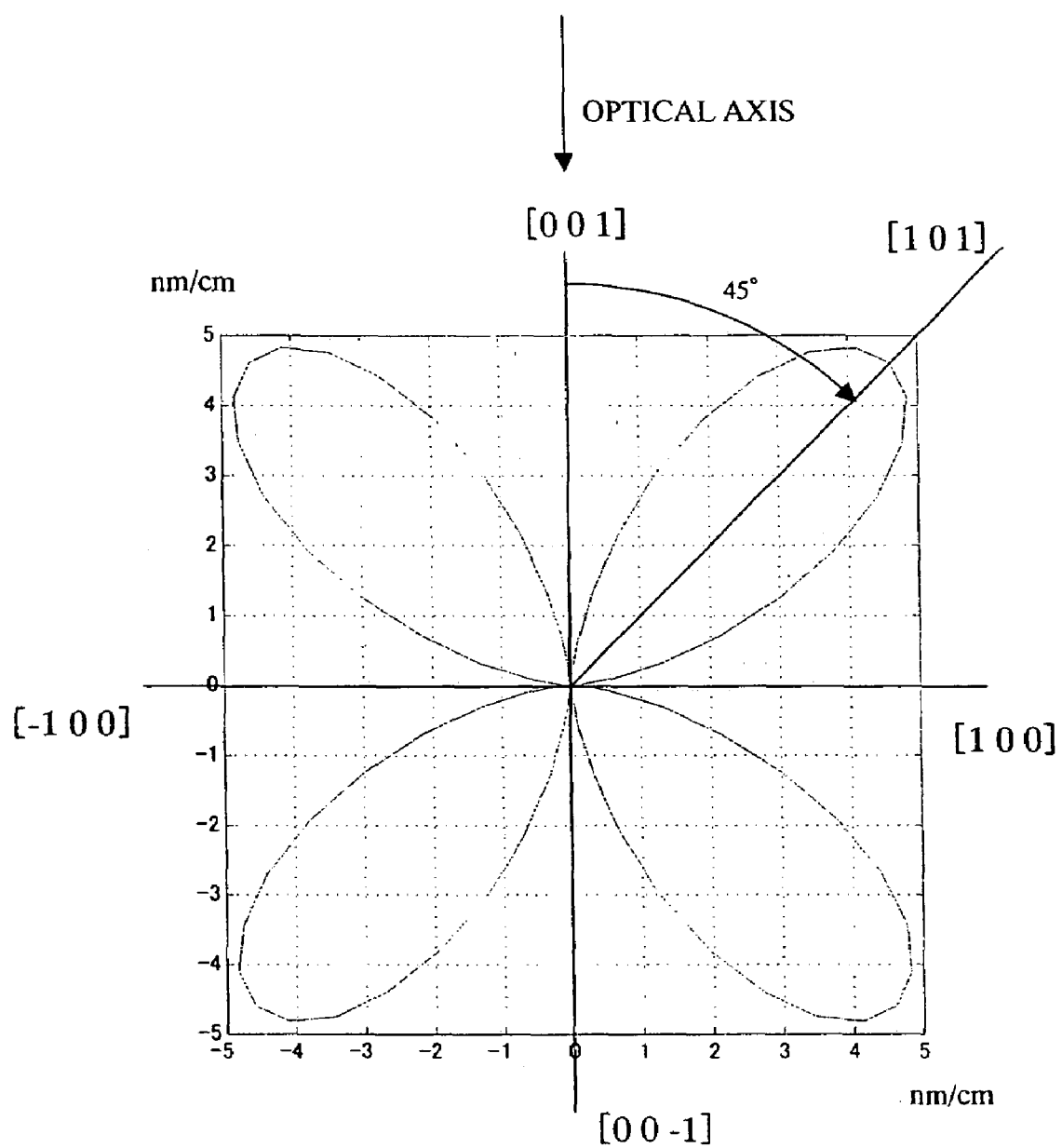
FIG. 4 shows a result of simulation in which the intrinsic birefringence and orientations thereof in a plane containing an [0 0 1] axis and a [1 0 0] axis are two-dimensionally illustrated, and indicates an optical axis and an angle formed between the optical axis and a light beam for which intrinsic birefringence represents a peak, when the [0 0 1] axis is made identical with the optical axis.
Figure 5:
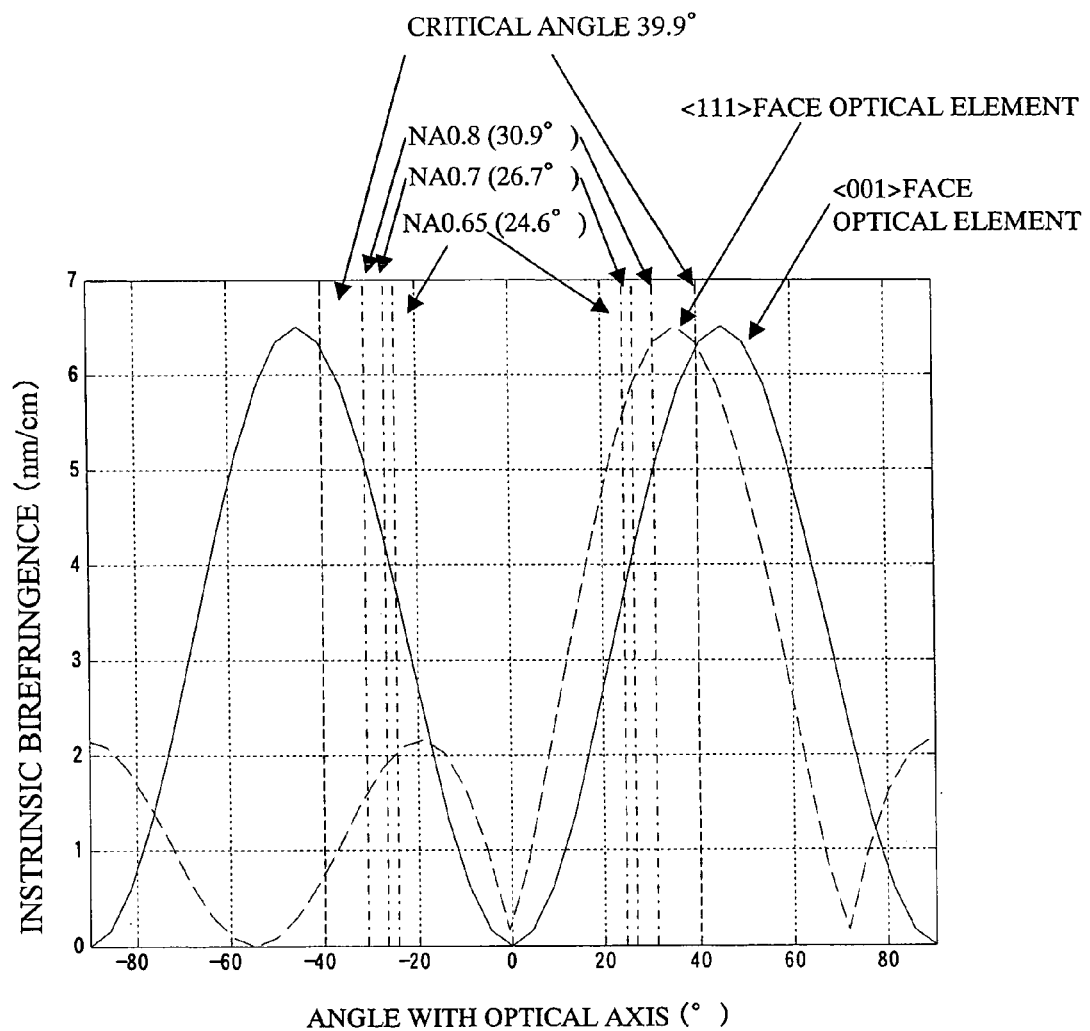
FIG. 5 is a diagram for showing a relationship between an angle of a light beam in a crystal and intrinsic birefringence.

Referring now to FIGS. 1 through 5, a description will be given of the reason for the above phenomenon, as well as an optical element 100 and a projection optical system 200 to which the optical element 100 is applicable. FIG. 1 is a schematic illustration of the optical element 100 of the present invention. FIG. 2 is a schematic side view of the projection optical system 200 to which the optical element 100 as shown in FIG. 1 is applied. FIG. 3 is a result of simulation in which intrinsic birefringence quantities of calcium fluoride and orientations thereof with the wavelength of 157 nm are three-dimensionally illustrated. FIG. 4 shows a result of simulation in which the intrinsic birefringence quantities and orientations thereof in a plane containing an [0 0 1] axis and a [1 0 0] axis are two-dimensionally illustrated, and indicates an optical axis and an angle formed between the optical axis and a light beam for which intrinsic birefringence represents a peak, when the [0 0 1] axis is made identical with the optical axis. FIG. 5 is a diagram for showing a relationship between an angle of a light beam in a crystal and intrinsic birefringence. In FIGS. 3 and 4, a distance from a point of origin indicates the intrinsic birefringence (quantities). The intrinsic birefringence as shown in FIG. 3 exhibits symmetry in each quadrant, and thus a description will be given mainly with reference to the first quadrant. Since the results may be the same in other quadrants, a duplicate explanation will be omitted in this application. Although a reference was made above to the phenomenon that an optical axis made identical with a [0 0 1] axis could rather reduce the effect of the intrinsic birefringence, the symmetry of the intrinsic birefringence suggests that [0 1 0] and [1 0 0] axes may exert the same action and effect as the [0 0 1] axis. Therefore, it is to be understood that the [0 0 1] axis may be substituted with the [1 0 0], [0 1 0], and other five axes, and that the [0 0 1] axis typifies these six axes in the present application.

As clearly shown in FIG. 3, a $CaF_2$ single crystal represents small quantities of the intrinsic birefringence; in this respect, an optical element such as a lens could advantageously be formed by making the optical axis identical with the [1 1 1] axis. However, $CaF_2$ exhibits, for example, peaks of the intrinsic birefringence quantities (6.5 nm/cm, the experimental results by Burnett, et al.) for twelve symmetrical directions such as the [1 1 0] axis and other axes. In the realm of the projection optical systems, for example, NA tends to increase associated with the trends toward birefringence quantities with respect to a light beam identical with the [1 1 1] axis, but the light beams tilted apart from the [1 1 1] axis (i.e., having larger NA) could include such a beam as is tilted at 35.26° and exhibits a peak of the intrinsic birefringence, as described above. The critical angle of light beams with the wavelength of 157 nm incident on $CaF_2$ is about 39.9°, and if the [1 1 1] axis is adopted as an optical axis of an optical element to be applied to an optical system with high NA, the marginal light beam passes near a place in which the peak of the intrinsic birefringence quantities is exhibited; therefore, the projection optical system having such an optical element would disadvantageously deteriorate an image-forming quality.

Accordingly, the optical element 100 according to the present invention is characterized in that an optical axis O is made identical with the [0 0 1] axis with respect to a crystal orientation. The intrinsic birefringence quantity of a light beam passing along the [0 0 1] axis, like the [1 1 1] axis, represents a small value. In the optical element 100 in which the optical axis O is made identical with the [0 0 1], as clearly shown in FIG. 4, the intrinsic birefringence exhibits the largest value when a light beam enters at 45° apart from the [0 0 1] axis. Next, as shown in FIG. 3, comparing an embodiment in which the optical axis is made identical with a [1 1 1] axis with another embodiment in which the optical axis is made identical with the [0 0 1] axis with respect to ray angles into a crystal face and the intrinsic birefringence, a ray angle at which the intrinsic birefringence exhibits the peak is 35.2°<45° that is greater when the optical axis is made identical with the [0 0 1] axis. Consequently, the optical element using <0 0 1> face, i.e., optical element 100 in which the optical axis O is made identical with the [0 0 1] axis could hardly deteriorate image-forming quality under high NA conditions. In addition, when the optical axis is made identical with the [1 1 1] axis, the peak of the intrinsic birefringence (quantities) is within the critical angle, but when the optical axis is made identical with the [0 0 1] axis, the peak of the intrinsic birefringence (quantities) is out of the critical angle. Therefore, the use of the [0 0 1] axis may prevent the birefringence from representing the peak in an optical system with high NA. Moreover, it is understood that the intrinsic birefringence of the optical element 100 in which the optical axis is made identical with the [0 0 1] axis exhibits a smaller value, even if the NA is 0.65, 0.7, or 0.8.

As is sometimes the case with the optical element 100 of the present invention, even if the optical system 100 is manufactured with an effort to make the optical axis O of a light beam identical with the [0 0 1] axis, the [0 0 1] axis would, in actuality, not precisely identical with the optical axis 0 due to manufacturing errors. Thus, the inventive optical element 100 does not require the optical axis O of the light beam to be strictly identical with the [0 0 1] axis. However, for the reasons as will be described later, the optical element 100 should be so configured that an angle between the optical axis O and the [0 0 1] axis is at least less than 10°. FIG. 5 explains that. Assume that the optical axis O of the optical element 100 is tilted at 10° with the [0 0 1] axis, and light beams parallel to the optical axis O are emitted into the optical element 100. In actuality, however, the incident light emitted into the optical element 100 at right angles enters obliquely at 10° with the [0 0 1] axis (e.g., the optical axis as in FIG. 4 is tilted at 10° to the left). In this case, unless a solid line shown in FIG. 5 is shifted relatively to the left by 10°, the actual optical axis of the right beams is not emitted in such a direction in which the intrinsic birefringence (quantities) exhibits the smallest value. Under these circumstances, the solid line becomes substantially identical with a broken line, and the relationship between the intrinsic birefringence and an angle of light incidents in the crystal would become substantially the same as in the case where the optical axis of the light beams is made identical with the [1 1 1] axis as in the conventional embodiment. (Assuming that the optical axis in FIG. 4 is tilted at 10° to the right, the intrinsic birefringence (quantities) would not exhibit appropriate values unless the solid line shown in FIG. 5 is shifted to the left by 10°. Under these circumstances, it is also deemed unfavorable that a peak of the intrinsic birefringence located at the left side in FIG. 5 would be within the critical angle.) Moreover, if the optical axis O is deviated from the [0 0 1] axis by more than 10°, the optical axis O is unfavorably so close to an orientation in which the intrinsic birefringence exhibits the peak. Consequently, in order to eliminate the above-described disadvantages, the present invention restricts an angle formed between the [0 0 1] axis and the optical axis O of the optical element 100 to less than 10°, with consideration given to the manufacturing errors.

As shown in FIG. 2, the above optical element 10 is suitably applicable to a projection optical system 200, and preferably applicable to an optical component L1 located at a side of an image plane P of the projection optical system in particular when the power of the projection optical system is demagnification. As shown in FIG. 2, the projection optical system 200 is comprised of four optical components L1 through L4, and in the present embodiment, the optical element 100 is applied to the optical component L1 that comes first when counted from the side of the image plane P. However, the number of the optical components L1 through L4 in the projection optical system 200 is exemplary only and not limited to four. In addition, if the projection optical system 200 represents a high NA value at the side of the image plane P, then the optical element 100 may be applied to the optical component L2 that comes second when counted from the side of image plain P. As described above, the optical components so located as above have the maximum angle formed between the light beams and the light axis O representing a large value in the optical components. To be more specific, the optical element 100 may be used for the optical components that have the maximum angle of 25° or greater. The angle of 25° corresponds to 0.65 of NA, and the present invention is suitable for a high NA value of 0.65 or greater.

Figure 6:
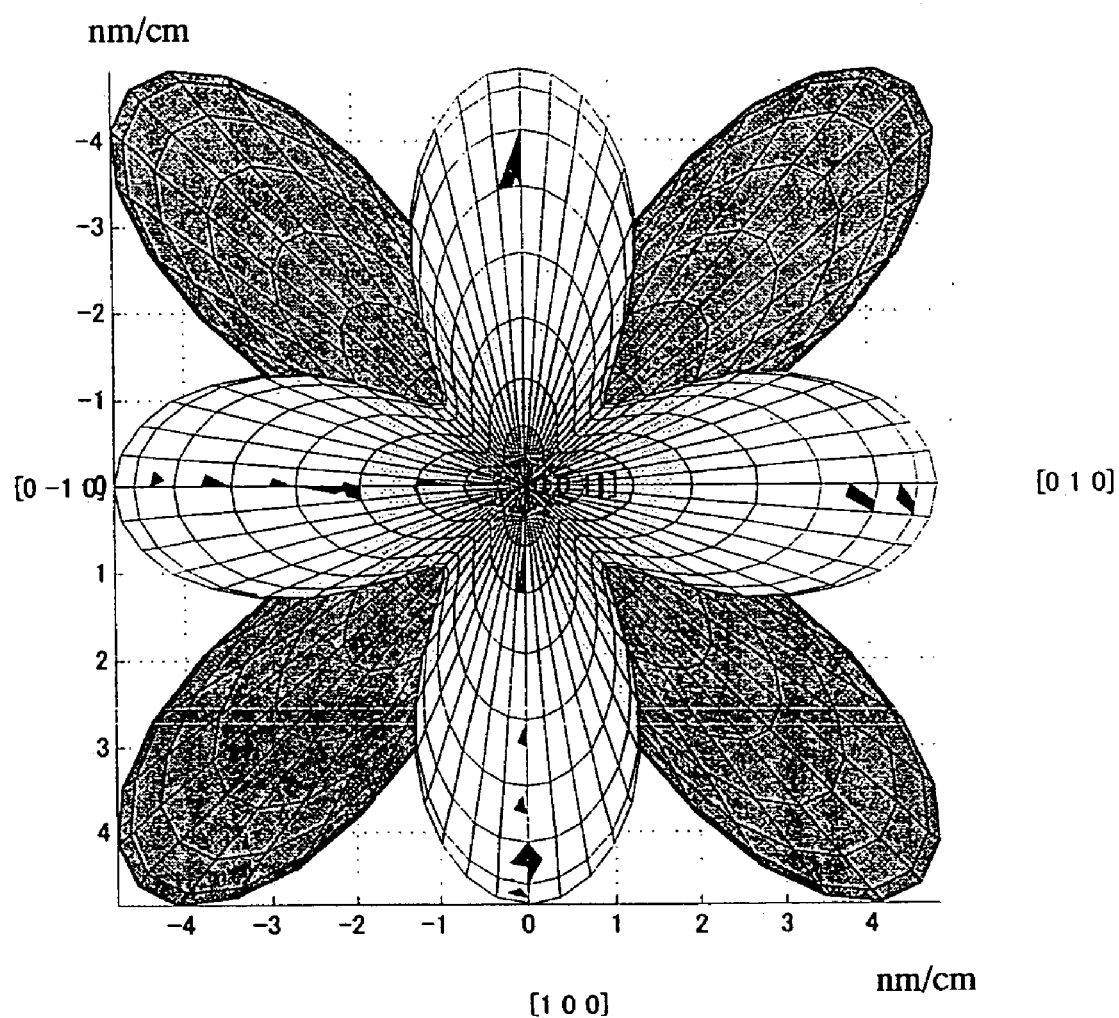
FIG. 6 is a result of simulation for showing the intrinsic birefringence when the result of simulation shown in FIG. 3 is viewed from a direction of the [0 0 1] axis.
Figure 7:
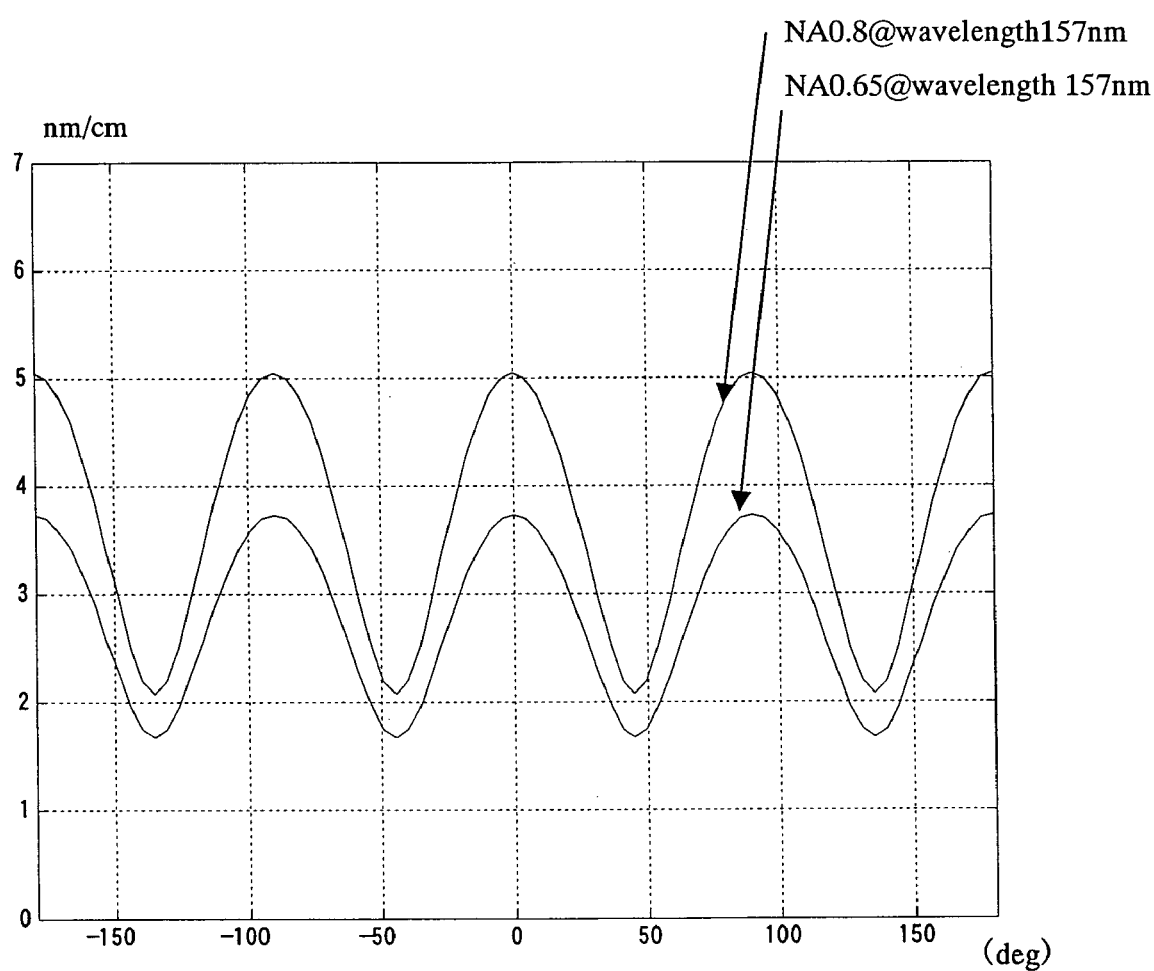
FIG. 7 is a diagram for showing intrinsic birefringence for orientation angles around an optical axis.
Figure 14:
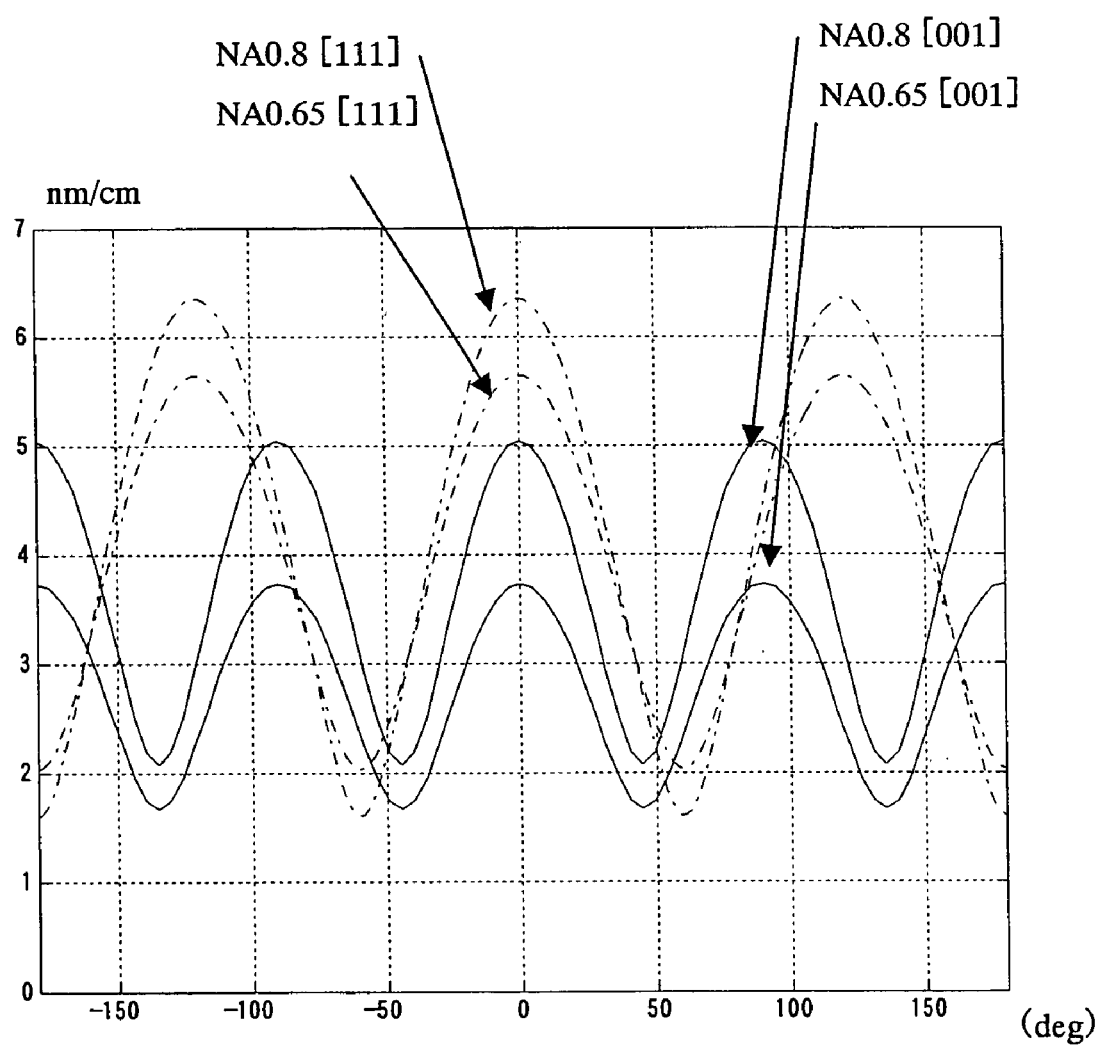
FIG. 14 is a diagram in which intrinsic birefringence for orientation angles around an optical axis in a <1 1 1> face is added to the diagram shown in FIG. 7.

Referring now to FIGS. 3, 6, and 7, peaks of the intrinsic birefringence lie along two intersecting orientations in 90° intervals around the optical axis O on the <0 0 1> face of the optical element 100. FIG. 6 is a result of simulation for showing the intrinsic birefringence when the result of simulation shown in FIG. 3 is viewed from a direction of the [0 0 1] axis. FIG. 7 shows intrinsic birefringence for orientation angles around an optical axis. Referring to FIG. 14, peaks of the intrinsic birefringence appears in 120° intervals around the optical axis on the <1 1 1> face. FIG. 14 is a diagram in which intrinsic birefringence for orientation angles around an optical axis in the <1 1 1> face is added to the diagram shown in FIG. 7. As clearly shown in the diagram, the intrinsic birefringence for orientation angles around the optical axis exhibits a relatively smaller value in the <0 0 1> face compared with the <1 1 1> face; in this respect, too, it is understood that the inventive optical element 100 has little tendency to suffer from the effect of the intrinsic birefringence.

Figure 8:
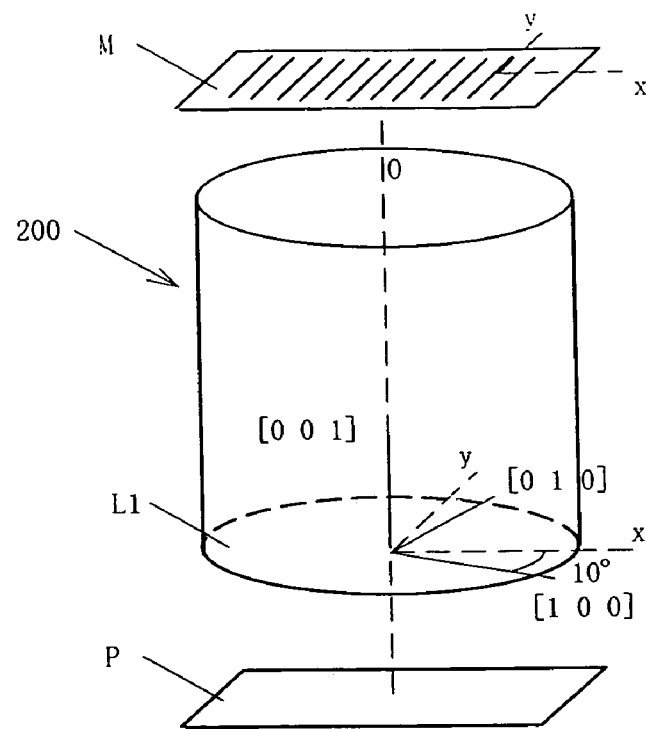
FIG. 8 is a schematic perspective view for showing the projection optical system as shown in FIG. 2.

Turning to FIG. 8, as a pattern of an object M that the projection optical system forms is typically used among characteristic patterns of angles such as 0°, 45°, and 90°. FIG. 8 is a schematic perspective view of the projection optical system 200 as shown in FIG. 2. In FIG. 8, part of optical components in the projection optical system 200 is not illustrated. The characteristic patterns include a pattern forming an angle of 0°, 45°, or 90° with respect to one direction (e.g., y-direction) of the object M, or a pattern formed in combination with more than one of these patterns. In FIG. 8, a pattern forming an angle of 0° with respect to the y-direction is illustrated. When the projection optical system 200 forms a pattern as above, if any one of two orientations of the peaks of the intrinsic birefringence and a light path of pencils of light that forms the pattern of the object M were identical, the image-forming quality would be deteriorated. Therefore, the projection optical system including the optical element 100 of the present invention preferably has the optical component L1 located with an orientation thereof shifted by 10° or greater so that any one of orientations of the peaks of the intrinsic birefringence is not made identical with the direction of the pattern.

Figure 9:
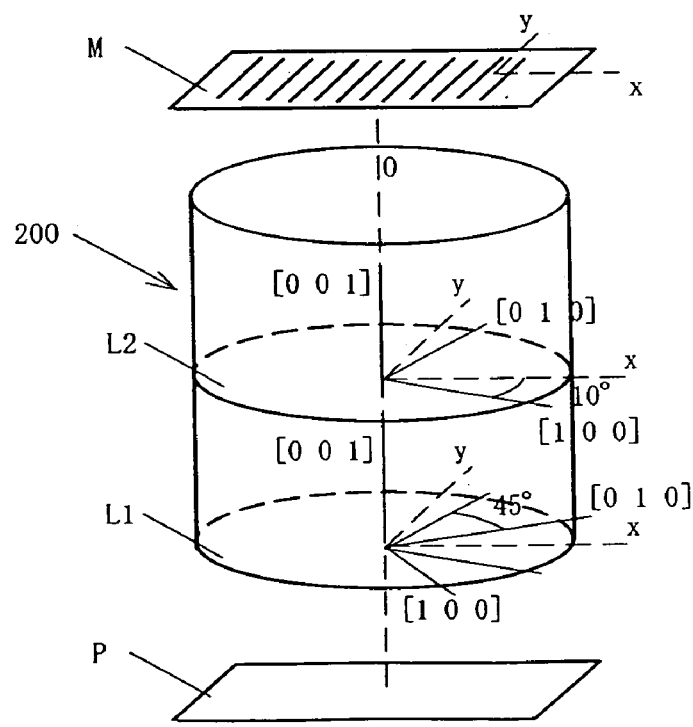
FIG. 9 is a schematic perspective view for showing an exemplified embodiment of the projection optical system as shown in FIG. 2.

Further, if the optical element 10 is applied to the two optical components L1 and L2 in the projection optical system 200, as shown in FIG. 9, the [0 1 0] axis (or [1 0 0] axis) perpendicular to the [0 0 1] axis of any one of the optical components L1 and L2 is preferably located in an orientation shifted by 45° around the optical axis. FIG. 9 is a schematic perspective view for showing an exemplified embodiment of the projection optical system 200 as shown in FIG. 2. In FIG. 9, part of optical components in the projection optical system 200 is not illustrated. The above embodiment is implemented because the projection optical system 200 including two of the optical elements 100 in which the peaks of the intrinsic birefringence appearing as two intersecting directions are not made identical with the respective optical axes may achieve improvement in the optical properties of the projection optical system 200. If the projection optical system 200 includes more than one of the optical elements 100, the number of which is n, then the optical elements may preferably be located with one displaced from another around the optical axis so that a [0 1 0] axis perpendicular to the [0 0 1] axis of one of the optical elements and a [0 1 0] axis perpendicular to the [0 0 1] axis of another of the optical elements form an angle within 90/n±10° with each other.

Figure 15:
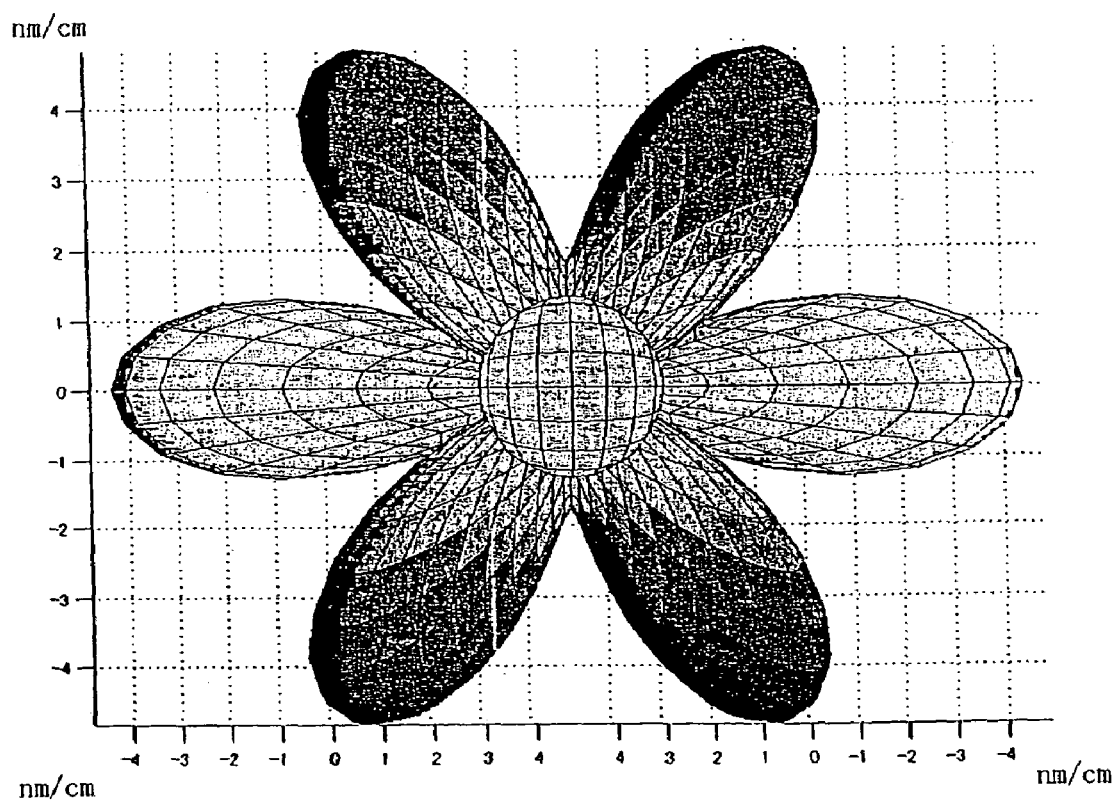
FIG. 15 is a result of simulation for showing the intrinsic birefringence when the result of simulation shown in FIG. 3 is viewed from a direction of the [1 1 0] axis.

Further, from a further and thorough study, the inventors, et al. of the present invention concluded that the embodiment where the optical axis is made identical with a peak of the intrinsic birefringence (quantities) (e.g., [1 1 0] axis), as where the optical axis is made identical with the [0 0 1] axis, could reduce the effect of the intrinsic birefringence. FIG. 15 is a result of simulation for showing the intrinsic birefringence when the result of simulation shown in FIG. 3 is viewed from a direction of the [1 1 0] axis. Although the [1 1 0] axis is used as an axis where a peak of the intrinsic birefringence appears for explanation purposes, the present invention is not limited to the [1 1 0] axis. As described above, the intrinsic birefringence exhibits peaks in twelve directions, and the use of the [1 1 0] axis in the present embodiment is exemplary only. Accordingly, it is to be understood that the [1 1 0] axis as referred to in the description may be substituted with other axes such as the [1 0 1] axis and the [0 1 1] axis, and the [1 1 0] axis represents these twelve axes.

Figure 16:
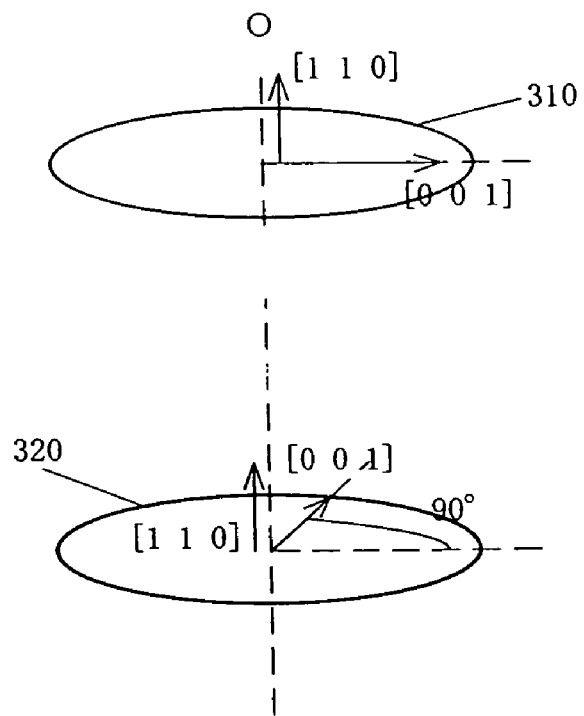
FIG. 16 is a schematic diagram for showing an optical system of the present invention.
Figure 17:
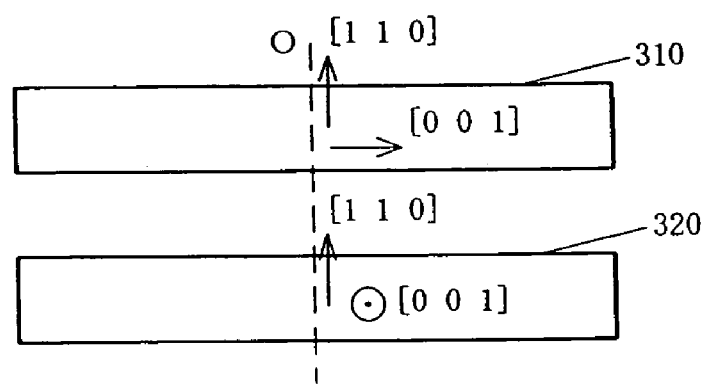
FIG. 17 is a schematic sectional view of the optical system as shown in FIG. 16.

Referring now to FIGS. 16 and 17, a description will be given of the reason for reduction of the intrinsic birefringence (quantities) when optical axis is made identical with the [1 1 0] axis, and of an optical system 300 as another embodiment of the present invention. FIG. 16 is a schematic illustration of the optical system 300 of the present invention. FIG. 17 is a schematic sectional view of the optical system 300 as shown in FIG. 16. The optical system 300, which includes two optical elements (parallel flat plates) 310 and 320, characteristically achieves reduction of the intrinsic birefringence by combination of these two parallel flat plates 310 and 320. More specifically, the parallel flat plates 310 and 320 are the parallel flat plates of the same type (i.e., having the same orientation and thickness with respect to the crystal orientation), and the parallel flat plates 310 and 320 are so constructed that the optical axes of the parallel flat plates 310 and 320 (that are identical with a line normal to the plates 310 and 320) are made identical with the [1 1 0] axis of the crystal.

With regard to the parallel flat plates 310 and 320, the optical system 300 has these parallel flat plates 310 and 320 so arranged that the [1 1 0] axis of the parallel flat plates 310 and 320 is identical with the optical axis O. Moreover, the parallel flat plates 310 and 320 respectively have one axis perpendicular to the [1 1 0] axis identical with the optical axis, e.g., the [0 0 1] axis, so arranged as to relatively form a different angle with each other (where as the [0 0 1] axis is also exemplary only, the axis perpendicular to the [1 1 0] axis is not limited thereto). As clearly shown in FIG. 16, the parallel flat plates 310 and 320 have their [0 0 1] axes so arranged as in an orientation orthogonal to each other, that is, as to form a relative angle of 90°.

In the above configuration, this optical system 300 may retard (or advance) a phase of a polarized component that has advanced (or retarded) in the parallel flat plate 310 with respect to light beams incident on the optical system 300 by using the parallel flat plate 320, and thus may cancel displacement between the phases of the polarized components and reduce the effect of the intrinsic birefringence. To be more specific, the birefringence essentially has directions in which split light beams travel: one goes along the fast phase axis; the other along the slow phase axis. The fast phase axis works in a phenomenon where a polarized light beam travels in a medium (optical element in the present embodiment), which polarized light beam having an electric field component that oscillates in a plane containing an optical axis oriented to a light beam traveling direction and the fast phase axis, and thereby advances a phase with respect to another polarized light beam traveling in a direction orthogonal to the polarized light beam. In contrast, the slow phase axis works in an opposite phenomenon where a polarized light beam travels in a medium (optical element in the present embodiment) and thereby retards the phase. Accordingly, light beams passing through only one parallel flat plate 310 would produce phase deviation of the polarized light component, that is, intrinsic birefringence. Therefore, one more parallel flat plate 320 in which a fast phase axis and a slow phase axis changes places, that is, to have axes perpendicular to the [1 1 0] axis are perpendicular to each other is provided, so that phase deviation is cancelled.

Figure 18:
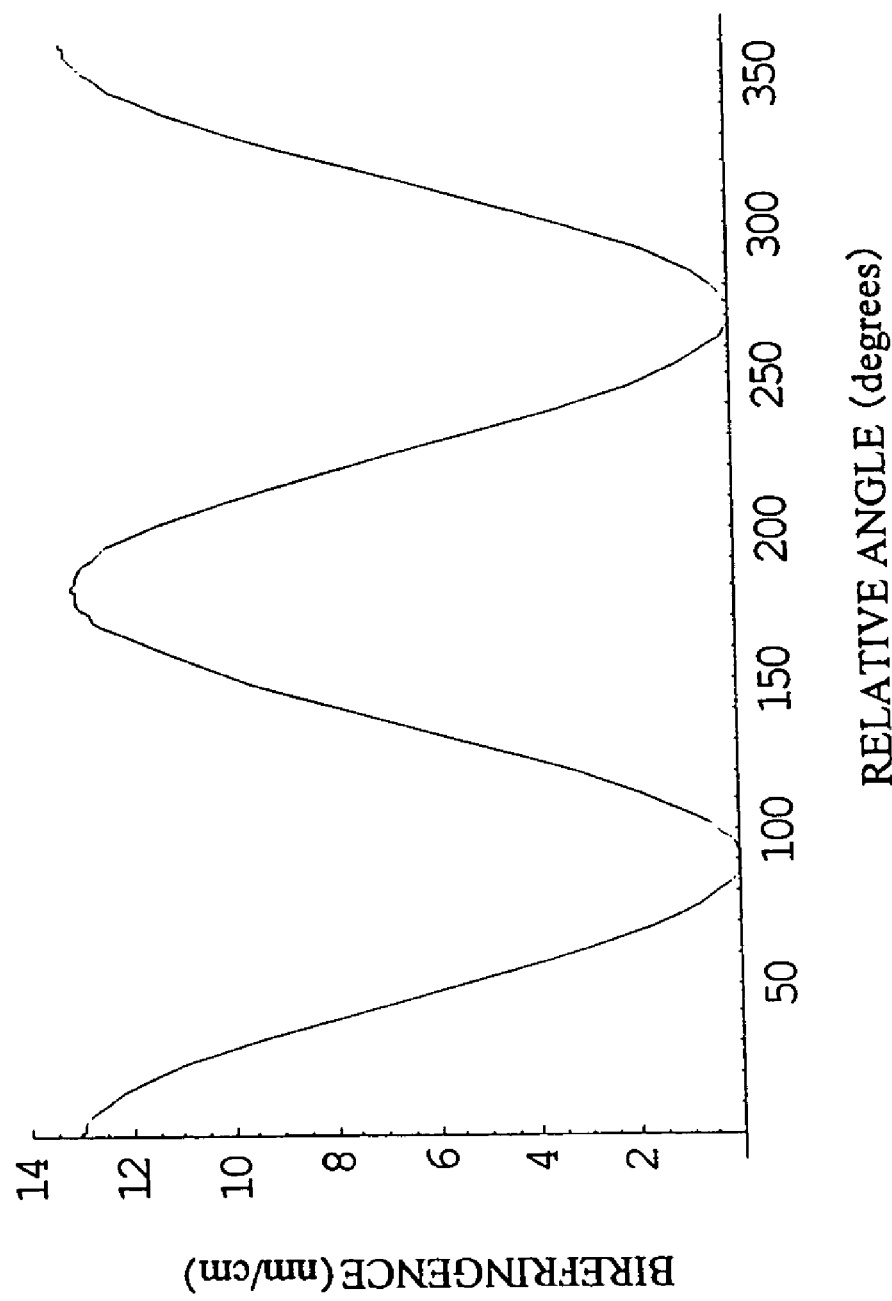
FIG. 18 is a result of simulation for showing intrinsic birefringence produced when a relative angle of two parallel flat plate, of which a [1 1 0] axis is the direction of an optical axis, around the optical axis is changed.

It is understood, referring to FIG. 18, that the two parallel flat plates 310 and 320 orienting each [1 1 0] axis to an optical axis direction may be so oriented as to change a relative angle around the optical axis, to reduce overall intrinsic birefringence of the optical system 300 comprised of the two parallel flat plates 31 and 320. FIG. 18 is a result of simulation for showing intrinsic birefringence produced when a relative angle of two parallel flat plate, of which a [1 1 0] axis is the direction of an optical axis, around the optical axis is changed. The two parallel flat plates have a thickness of 1 cm, and the wavelength in use is 157 nm. Referring to FIG. 18, it is easily understood that a change in relative angle around the optical axis of the two parallel flat plates would reduce the intrinsic birefringence in the two parallel flat plates, and the intrinsic birefringence when the relative angle is 45° or greater (less than 90°) is reduced in comparison with when one parallel flat plate is used. Further. If a relative angle between particular axes (e.g., the [0 0 1] axes) perpendicular to the [1 1 0] of the two parallel flat plates is 90°, the intrinsic birefringence (quantity) may represent the minimum value (0 nm/cm).

Figure 19:
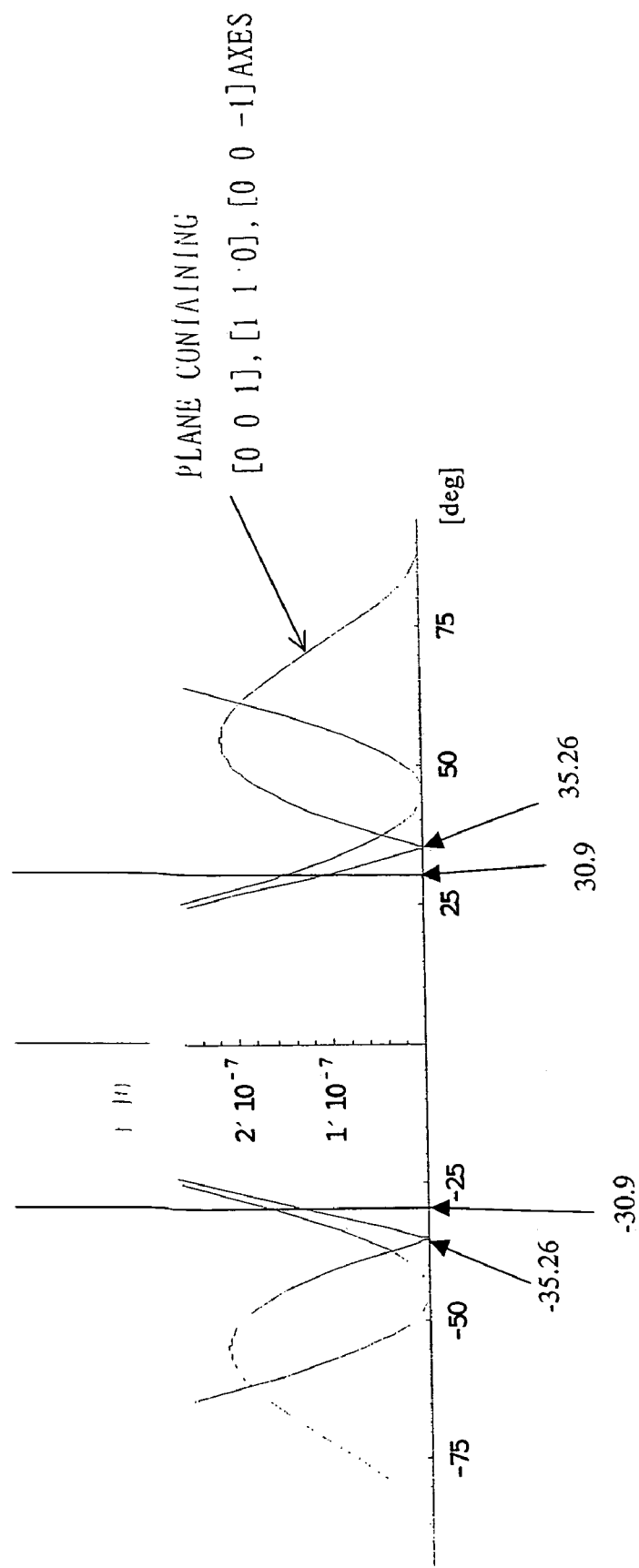
FIG. 19 is a diagram for showing intrinsic birefringence when an optical axis is tilted apart from a [1 1 0] axis with respect to a section containing [1 0 0], [1 1 0], and [0 1 0] axes and a section containing [0 0 1], [1 1 0], and [0 0 -1] axes.

Considering one section of the-optical system 300, if one parallel flat plate consists of a section containing [1 0 0], [1 1 0], and [0 1 0] axes, the other parallel flat plate consists of a section containing [0 0 1], [1 1 0], and [0 0 −1] axes. These sections of the optical system 300 may also reduce the effect of the intrinsic birefringence of the optical system 300 in the present invention with respect to components of light beams incident obliquely from the optical axis O. FIG. 19 shows intrinsic birefringence (quantities) when an optical axis is tilted apart from a [1 1 0] axis with respect to a section containing [1 0 0], [1 1 0], and [0 1 0] axes and a section containing [0 0 1], [1 1 0], and [0 0 −1] axes. Referring to FIG. 19, when a light beam is tilted from the optical axis, the intrinsic birefringence values with respect to each section substantially coincide with each other in a range between −30° and 30°. However, in FIG. 19, the intrinsic birefringence is indicated in absolute value, and the intrinsic birefringence (quantities) in the section containing [0 0 1], [1 1 0], and [0 0 −1] axes are of opposite sign in a range between −35.26° and 35.26°. This indicates that, in a range between −30° and 30°, even if light beams is tilted from the optical axis O the intrinsic birefringence may be canceled using the two parallel flat plates 310 and 320. Since an angle of 30° (more specifically 30.9°) corresponds to 0.8 in NA, it is suggested that the optical system 300 in the present invention is suitable for an optical system with high NA of 0.8 or more.

As described above, although the optical system 300 in the present invention has an axis of peaks of the intrinsic birefringence, i.e., [1 1 0] axis, the two parallel flat plates 310 and 320 may be used in combination, and thus the intrinsic birefringence in the optical system 300 is reduced. Accordingly, this optical system 300 may also achieve improvement of image-forming quality. It is proved that the optical system 300 is sufficiently applicable to the optical system with high NA.

The optical system 300 is exemplarily constituted of two parallel flat plates 310 and 320, but the number of optical elements is not limited. The optical system 300 may be constituted of more than two optical elements such as parallel flat plates, lenses, and diffraction optical elements. However, it is noted that a relative angle of the [0 0 1] axis perpendicular to these [1 1 0] axes of the optical elements should be varied to relatively reduce the intrinsic birefringence in the optical system 300.

Figure 20:
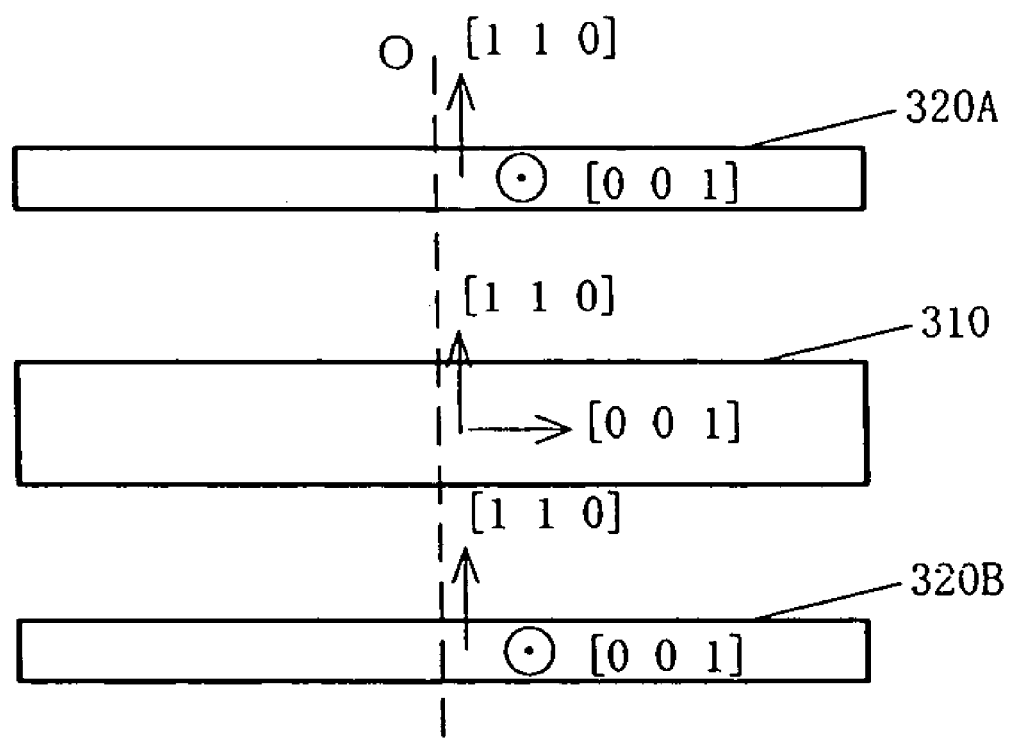
FIG. 20 is a schematic diagram for showing an optical system 300A as a variation of the optical system 300 as shown in FIGS. 16 and 17.

For example, as clearly shown in FIG. 20, an optical system 300A constituted of three parallel flat plates is made by separating the parallel flat plate 320 (or parallel flat plate 310) as shown in FIGS. 16 and 17 into two. FIG. 20 is a schematic diagram for showing the optical system 300A as a variation of the optical system 300 as shown in FIGS. 16 and 17. In FIG. 19, the parallel flat plates 320A and 320B are made by separation of the parallel flat plates 320 as shown in FIGS. 16 and 17 with respect to a plane perpendicular to the [1 1 0] axis, and in FIG. 20, a thickness of each parallel flat plate 320A and 320B is exemplarily half of the parallel flat plate 320. This allows the parallel flat plate 320A and 320B to have a varied relative angle of axes (e.g., [0 0 1] axis) perpendicular to the [1 1 0] axis with respect to the parallel flat plate 310, and to exert the same action as the parallel flat plate 320. In FIG. 20, the parallel flat plates 320A and 320B are so constructed as to sandwich the parallel flat plate 310, but the parallel flat plates 320A and 320B may be located in a row at one side of the parallel flat plate 310. Even in this configuration, a phase difference in polarized components may be canceled and the same effect as in the optical system 300 may be obtained. Optionally, one more parallel flat plate (having the same crystal orientation and thickness as the parallel flat plates 310 and 320) may be added to the optical system 300 in such a manner that the [1 1 0] axis coincides with the optical axis, to configure the optical as one that consists of three parallel flat plates. However, this optical system should be constructed by varying a relative angle of one axis (e.g., the [0 0 1] axis) perpendicular to the [1 1 0] axis of three parallel flat plates so as to minimize the phase difference of polarized components.

If the optical system 300 is a system 300B (not shown) that consists of four or more parallel flat plates, of which the number is n (n: an even number), the above-described parallel flat plates 310 and 320 are paired, and the pairs, the number of which is n/2, is used to constitute the optical system. Moreover, if the optical system 300 consists of five or more parallel flat plates, of which the number is m (m: an odd number), the above-described parallel flat plates 310 and 320 are paired, and the pairs, the number of which is (m−3)/2, is used and the above-described combination is applied to the remaining three of the parallel flat plates, to constitute the optical system.

Although parallel flat plates are exemplarily described as more than one optical element of the optical systems 300A, 300B in the present embodiment, this embodiment may apply also when the optical element is a lens or a diffraction optical element, or when these optical elements of multiple kinds including a parallel flat plate are incorporated in combination.

The optical system 300 of the present invention is suitable for a projection optical system 400 as well as the above optical element 100. The projection optical system 400 is constituted of four optical components L1 through L4 for illustration purposes, and thus a description will be given with reference to FIG. 2 again. The number of optical components L1 through L4 in the optical system 200 is exemplary only, and not limited to four. If the power of the projection optical system 400 of the present invention is demagnification, the parallel flat plates 310 and 320 of the optical system 300 are suitably applicable to optical components L1 and L2 located at a side of an image plate P of the projection optical system 400. However, if the optical system 300 is counted as one system including one pair of the parallel flat plates 310 and 320, it may be understood that the optical system 300 is applied to the optical component L1 as shown in FIG. 2. In the projection optical system 400, the optical components L1 and L2 is preferably achieved as parallel flat plates. Moreover, if the projection optical system 300 is of high NA at the side of image plane P, the optical system 300 may be applied also to the optical component L3 or the like that is the third or farther component from the side of the image plane P. This is, as described above, because the maximum angle formed between a light beam and the optical axis O becomes greater in the optical component as located in a position as above, and more specifically the optical system 300 may preferably applied to an optical component in which the maximum angle is 25° or greater. The angle of 25° corresponds to an NA value of 0.65, and the present invention is suitably applicable for a high NA value of 0.65 or greater. This would not deteriorate an image-forming quality even with a marginal light beam (outmost light beam among those in the projection optical system 400) incident, and contributes to improved optical properties of the projection optical system 400.

For the optical components L3 and L4 to which the optical system 300 is not applied among optical components consisting of the projection optical system 400 are preferably used an optical element in which the above [1 0 0] axis is made identical with the optical axis, or an optical element in which the [1 1 1] axis is made identical with the optical axis, or a combination thereof. In this case, as described above, preferably, a relative angle of an axis perpendicular to the optical axis (i.e., the [1 0 0] or [1 1 1] axis) is varied, and an adjustment is made to make the intrinsic birefringence of the projection optical system 400 smaller (e.g., rotate the optical element about the optical axis). However, even if the optical components L1 through L4 constituting the projection optical system 400 are comprised of the two optical systems 300, the optical systems 300 may be adjusted relatively so as to make the intrinsic birefringence smaller.

In the optical system 300 and the optical systems such as projection optical systems 200 and 400, when birefringence (deviation of wavefronts due to birefringence) in the whole optical system becomes one fourth or less of the wavelength $\lambda$ in use, the image-forming quality would disadvantageously be deteriorated due to the birefringence (including stress birefringence and intrinsic birefringence). For example, in the $F_2$ excimer laser with the wavelength $\lambda=157$ nm, unless the birefringence (quantity) throughout the optical system is substantially 40 nm/cm or less, excellent image-forming conditions cannot be obtained. The birefringence throughout the optical system may be measured for example by interference experiments and commercially available birefringence measuring equipment, and it is preferable the optical system should be adjusted using these means.

Figure 10:
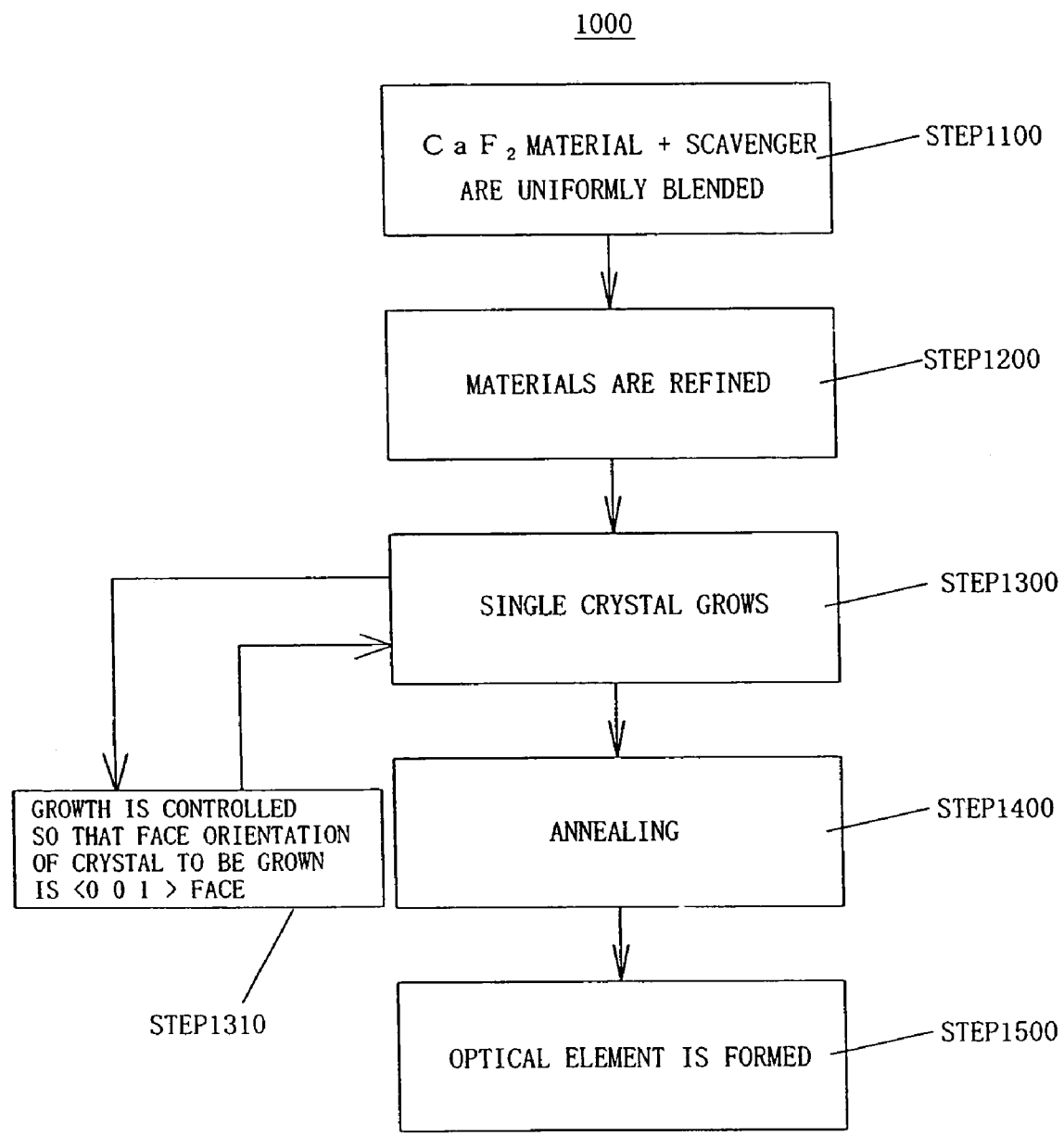
FIG. 10 is a flowchart of a manufacturing method for an optical element using $CaF_2$ according to the present invention.

A description will now be given of a manufacturing method for $CaF_2$ crystals and optical elements 100 using the crucible descent method. The method of the present invention is however not limited thereto. FIG. 10 shows a flowchart of the manufacturing method for an optical element using $CaF_2$ according to the present invention. First, as a row material prepared is a high-purity $CaF_2$ synthetic material, which is blended with a scavenger (step 1100). The high-purity $CaF_2$ synthetic material is prepared by treating calcium carbonate with hydrogen fluoride. The present invention is not limited thereto but also applicable to a method for eliminating adulterant (e.g., $SiO_2$) by treating $CaF_2$ in ore with hydrogen fluoride; however, the high-purity $CaF_2$ is, unlike $CaF_2$ in ore, powdery, and is preferably very low in volume density (approximately 10 through 20 μ). When the $CaF_2$ material is blended with a scavenger in a vessel (or crucible), the vessel is preferably rotated to obtain a uniform blend.

As a scavenger is preferably employed a fluoride such as zinc fluoride, cadmium fluoride, bismuth fluoride, sodium fluoride, lithium fluoride, and the like, which are more likely to combine with oxygen than fluoride that induces growth. A substance that easily reacts with an oxide mixed in a fluoride material to vaporize is selected. In particular, zinc fluoride is preferable.

The resultant blend of calcium fluoride powder and scavengers are refined (step 1200). The refining process is a process to remove impurities (e.g., carbonic acids) to highly refine calcium fluoride, and comprises the steps of dehydration, scavenging reaction, removal of scavenged products, melting, and solidification. In the refining step, the blend is put into a crucible of a refinement furnace. Thereafter, a heater is energized to heat and dehydrate the blend in the crucible.

Next, the refined crystal is used as a secondary material to grow a single crystal of calcium fluoride in a crystal growth furnace (not shown) (step 1300). Among growing methods is selected an appropriate method according to desired dimensions and uses of a resultant crystal: for example, the Bridgman method is used to grow a single crystal by gradually lowering the crucible. In this process, a seed crystal as an origin of growth having a desired face orientation. i.e., to the <0 0 1> face, in which deposition should proceed, need be placed at a bottom of the crucible, so that the face orientation of the crystal to be grown is controlled (step 1310).

Then, a heater is energized and a calcium fluoride material (crystal) is heated to approximately 1,390 through 1,450° C., to completely melt the calcium fluoride crystal. Thereafter, the crucible is gradually lowered at a velocity of 0.1 through 5.0 mm/h (to experience a predetermined temperature gradient), and the melted calcium fluoride is gradually cooled; thereby a single crystal grows based upon the seed crystal.

Subsequently, the fluoride single crystal that has grown is heat-treated in an annealing furnace (annealing process) (step 1400). The anneal process is such that a grown calcium fluoride single crystal is treated with heat to remove internal stresses is and to make the crystal less brittle. The grown single crystal is put in the crucible stored in a chamber in the annealing furnace.

In the annealing process, the crucible is uniformly heated at about 900° C. through 1,000° C. and internal stresses in the calcium fluoride are removed while the material is kept solid. Heating at about 1,140° C. or higher temperature would disadvantageously cause a structural change or the like. Heating time should be about 20 hours or longer, and preferably about 20 through 30 hours. In the annealing process, annealing reduces dislocation of the crystal. Thereafter, the calcium fluoride crystal is kept without internal stress and left to cool into room temperature.

Thereafter, the calcium fluoride is formed into an optical element 100 as required (step 1500). The optical element 100 may include a lens, a diffraction grating, a transparent parallel flat plate, an optical film, or a combination thereof, and the lens may, for example, include a multi-lens, a lens array, a lenticular lens, and an aspherical lens. In addition to simple lenses, the optical element 100 may be an optical sensor (e.g. sensor for controlling a focus). As necessary, a reflection prevention film may be provided on a surface of an optical article of fluoride crystal. To the reflection prevention film is suitably applicable magnesium fluoride, aluminum oxide, or tantalum oxide, which may be formed by vacuum evaporation using resistance heating, vacuum evaporation using electronic beams, and sputtering.

Although a calcium fluoride crystal is formed with consideration given to face orientations in the present embodiment, usable method is not limited thereto. For example, where a calcium fluoride crystal is manufactured by the Bridgman method, a horizontal face of calcium fluoride may be selected at random for each growing crystal without priority placed on a particular growth orientation. In this case, the calcium fluoride crystal may be sliced in such a manner that the <0 0 1> faces are two parallel flat planes from a calcium fluoride crystal obtained through crystal growth or from calcium fluoride crystal obtained through crystal growth followed by annealing process, and then the component may be treated with heat to improve optical properties thereof.

The above process is characterized in that the calcium fluoride crystal is sliced with the <0 0 1> face being parallel flat planes. This enables manufacture of the optical element 100 with consideration given to the intrinsic birefringence.

The optical elements (parallel flat plates 310 and 320) applicable to the optical system 300 may be manufactured by having a seed crystal as an origin of growth placed at a bottom of the crucible, which seed crystal has a desired face orientation, i.e., to the <0 0 1> face, in which deposition should proceed, so that the face orientation of the crystal to be grown is controlled, as in step 1300 shown in FIG. 10, or by slicing a calcium fluoride crystal in such a manner that the <1 1 0> faces are two parallel flat planes. The manufacturing method for an optical element is as described above, and thus a detailed description will be omitted.

Figure 13:
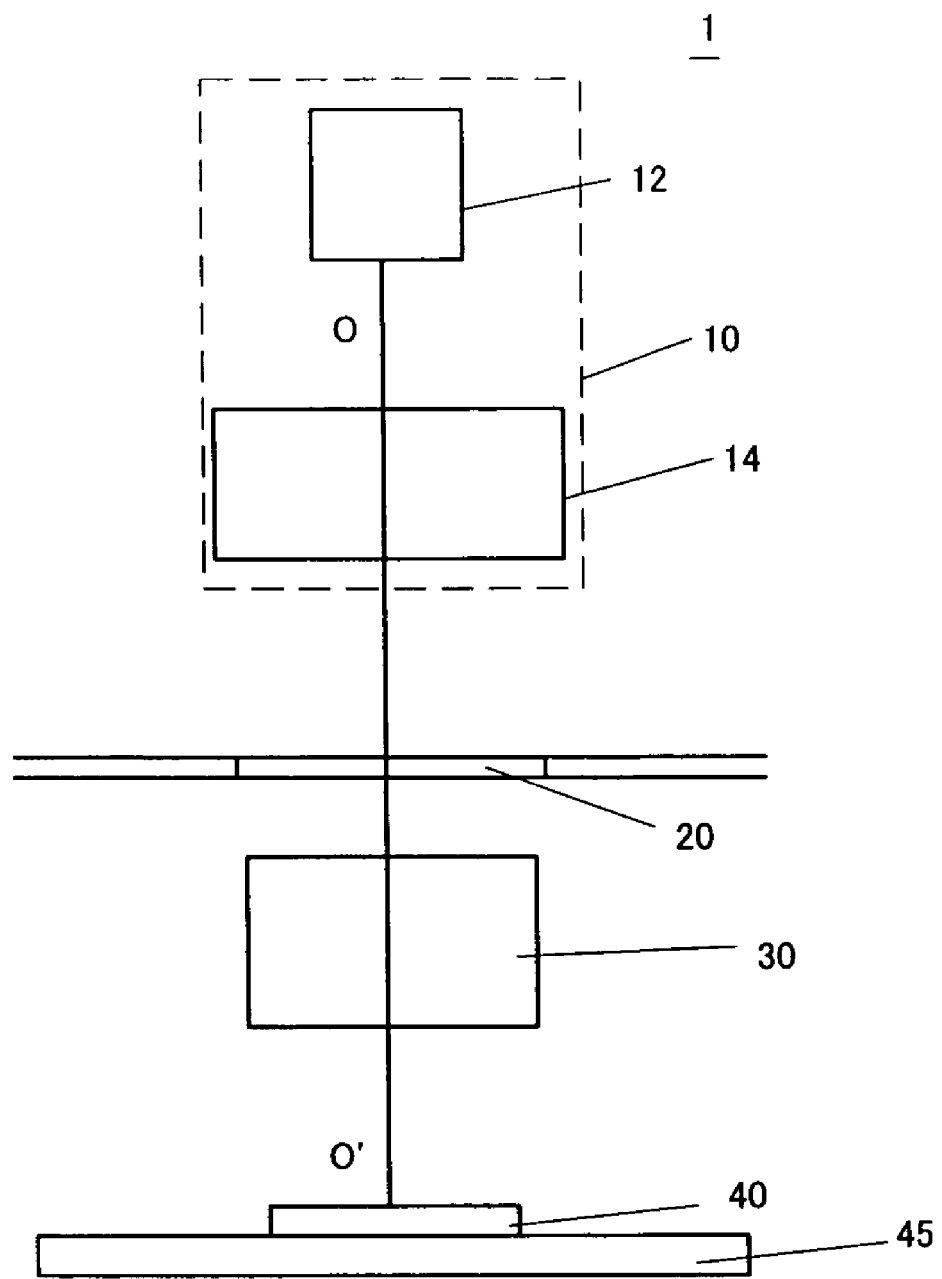
FIG. 13 is a schematic sectional view of an exemplified exposure apparatus of the present invention.

Referring now to FIG. 13, a description will be given of an exemplified exposure apparatus 1 of the present invention. FIG. 13 is a schematic sectional view of the exposure apparatus 1 of the present invention. The exposure apparatus 1 includes, as shown in FIG. 13, an illumination apparatus 10, a reticle 20, a projection optical system 30, a plate 40, and a stage 45. The exposure apparatus 1 is a scanning projection exposure apparatus that exposes the plate 40 to light through a circuit pattern formed on the reticle 20, using step-and-repeat or step-and-scan schemes.

The illumination apparatus 10, which includes a light source part 12 and an illumination optical system 14, illuminates the reticle 20 on which a circuit patter to be transferred is formed.

The light source part 12 may use, for example, a laser as a light source. An ArF excimer laser with the wavelength of approximately 193 nm and an $F_2$ excimer laser with the wavelength of approximately 157 nm may be used as the laser for the light source, but the types of usable lasers are not limited to such an excimer laser; therefore, a YAG laser may be used, and the number of lasers to be used is not limited. When a laser is used for the light source part 12, it is preferable to use a light beam shaping optical system for shaping collimated light beams from the laser light source into a desired beam shape, and a coherence-reducing optical system for making coherent laser beams incoherent. However, usable light sources for the light source part 12 is not limited to lasers, but one or more of mercury lamps or xenon lamps may also be usable.

The illumination optical system 14 is an optical system for illuminating a mask or reticle 20, and includes a lens, a mirror, a light integrator, an aperture, and the like. For example, a condensing lens, a fly-eye lens, an aperture stop, a condensing lens, a slit, and an image-forming optical system may be arranged in this sequence, or otherwise. The illumination optical system 14 may use light oil axis or light out of axis. The optical integrator may include integrators or the like made by overlaying fly-eye lenses or a pair of cylindrical lens array (or lenticular lens) plates, but may be substituted with an optical rod or a diffraction element.

The reticle 20, on which a circuit pattern (or image) to be transferred is formed, is held on a reticle stage (not shown) and driven. The reticle stage (not shown) may be two-dimensionally moved along a reticle surface by the action of a driving system (also not shown). Coordinates of the reticle stage may be measured and adjusted by an interferometer using a reticle movement mirror (not shown), and the positioning of the reticle may be controlled. Diffraction light emitted from the reticle 20 passes through the projection optical system 30, and projected on the plate 40. The plate 40 is an object to be processed such as a wafer and a liquid crystal substrate, and resist is applied to the plate 40. The reticle 20 and the plate 40 have a conjugate relationship. With a scanning projection exposure apparatus used, the mask 20 and the plate 40 are scanned and a pattern is transferred on the plate 40. With a stepper (exposure apparatus using step-and-repeat exposure method) used, the exposure is performed while the mask 20 and the plate 40 stands still.

The projection optical system 30, which has a magnification of ⅕ through ½, projects a demagnified image of a circuit pattern of the reticle 20 on the plate 40. The projection optical system 30 consists of a refraction system, and a substantially telecentric area at the both sides of the reticle 20 and the plate 40. All of multiple refraction optical elements (lenses and transparent plates) in the projection optical system 30 consist of calcium fluoride ($CaF_2$). In the exposure apparatus 1, the projection optical systems 200 and 400 as described above are preferably applied to the projection optical system 30, so that the projection optical system 30 may achieve better image-forming conditions than conventional projection optical systems. The optical element closest to the plate 40 in the projection optical system 30 is a transparent parallel flat plate, which is tilted from a horizontal plane as necessary to correct aberration. However, the projection optical system 30 of the present invention may use, other than the above, an optical system including a plurality of lens elements and at least one concave mirror (catadioptric optical system), an optical system including a plurality of lens elements and at least one diffraction optical element such as a kinoform. When correction for color aberration is required, a plurality of lens elements may be made of glass materials, which vary with each other in the degree of dispersion (Abbe number), or a diffraction optical element may be so constructed as to produce dispersion in a direction opposite to a lens element.

To the plate 40 is applied a photoresist. The photoresist application process includes a post-process, an adhesion improver application process, a photoresist application process, and a prebaking process. The post-process includes a cleaning step and a drying step. The adhesion improver application process is a surface reforming (i.e., hydrophobicity enhancement by application of surfactant) process, which coats the surface with an organic membrane such as HMDS (Hexamethyl-disilazane) or treats the same with vapor. The prebaking is a baking (burning) process that is softer than that after the development process, and serves to remove a solvent.

The stage 45 holds the plate 40. Since any components known in the art may be applied to the stage 45, a detailed description of a structure and operation thereof will be omitted. For example, the stage 45 may two-dimensionally move along a surface of the plate 40 by the action of a driving system (not shown), and coordinates of the stage 45 may be measured by an interferometer using a plate movement mirror (not shown), and thereby the positioning of the plate 40 may be controlled. The reticle 20 and the plate 30 is simultaneously scanned, with the scanning projection exposure apparatus used, and the positions of the stage 45 and the reticle stage (not shown) are monitored, for example, by a laser interferometer or the like, so that the both components are driven at a constant rate of velocity. The stage 45 is provided, for example, on a stage board supported on a floor or the like through a damper, while the reticle stage and the projection optical system 30 is provided, for example, on a lens barrel board (not shown) supported on a base frame placed on a floor or the like through a damper.

In exposure process, light beams emitted from the light source part 12 illuminate the reticle 20 via the illumination optical system 14, for example, by Kohler's method. Light that has passed through the reticle 20 to involve a mask pattern is projected and forms an image on the plate 40 via the projection optical system 30. The projection optical system 30 used in the exposure apparatus 1, which includes the inventive optical element 100, allows ultraviolet radiation, deep ultraviolet radiation, and vacuum ultraviolet radiation to pass with high transmittance and less refractive index uniformity or birefringence, and thus may provide devices (semiconductor devices, LCD devices, image pickup devices such as CCDs, thin-film magnetic heads, or the like) with high resolution and throughput, in a cost-effective manner.

Figure 11:
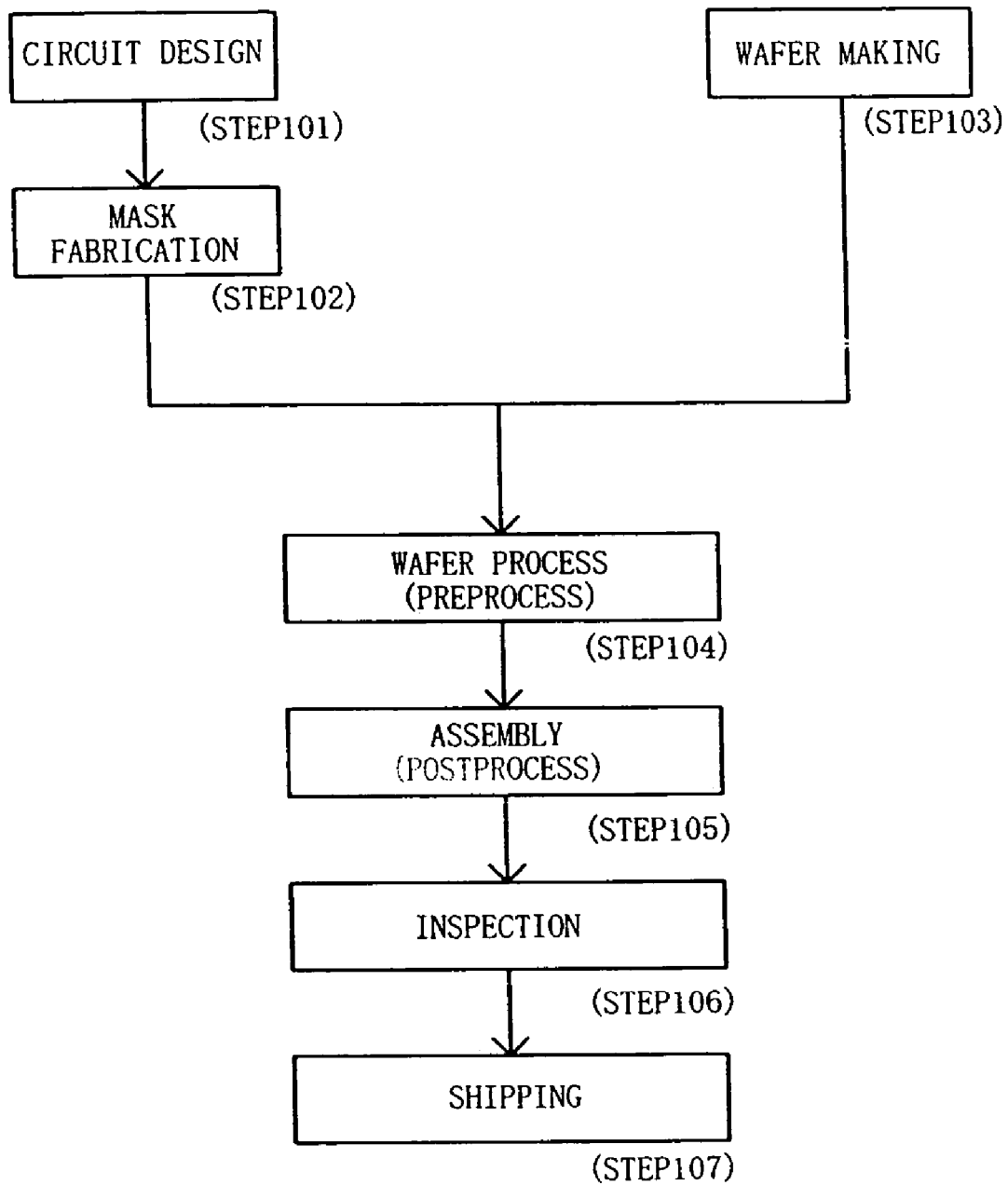
FIG. 11 is a flowchart for explaining manufacture of a device (e.g., semiconductor chips such as IC and LSI, LCD, CCD, and the like).

Next, referring to FIGS. 11 and 12, a description will be given of an exemplified manufacturing method for a device using the above-described exposure apparatus 1. FIG. 11 is a flowchart for explaining manufacture of a device (e.g., semiconductor chips such as IC and LSI, LCD, CCD, and the like). A manufacturing process of semiconductor chips will now be explained by way of example. In step 101 (Circuit design), a device circuit is designed. In step 102 (Mask fabrication), a designed circuit pattern is formed into a mask. In step 103 (Wafer making), a wafer is made using materials such as silicon. In step 104 (Wafer process), which is called preprocess, the mask and wafer are used to form actual circuitry on the wafer using the lithography technique. The step 105 (Assembly), which is called postprocess, in which the wafer processed in step 104 is used to create a semiconductor chip, includes the steps of assembly (dicing, bonding), packaging (chip sealing), and the like. In step 106 (Inspection), inspections such as an operation check, a durability check, and the like of the semiconductor device assembled in step 105 are conducted. A semiconductor device is finished through these steps, and shipped (in step 107).

Figure 12:
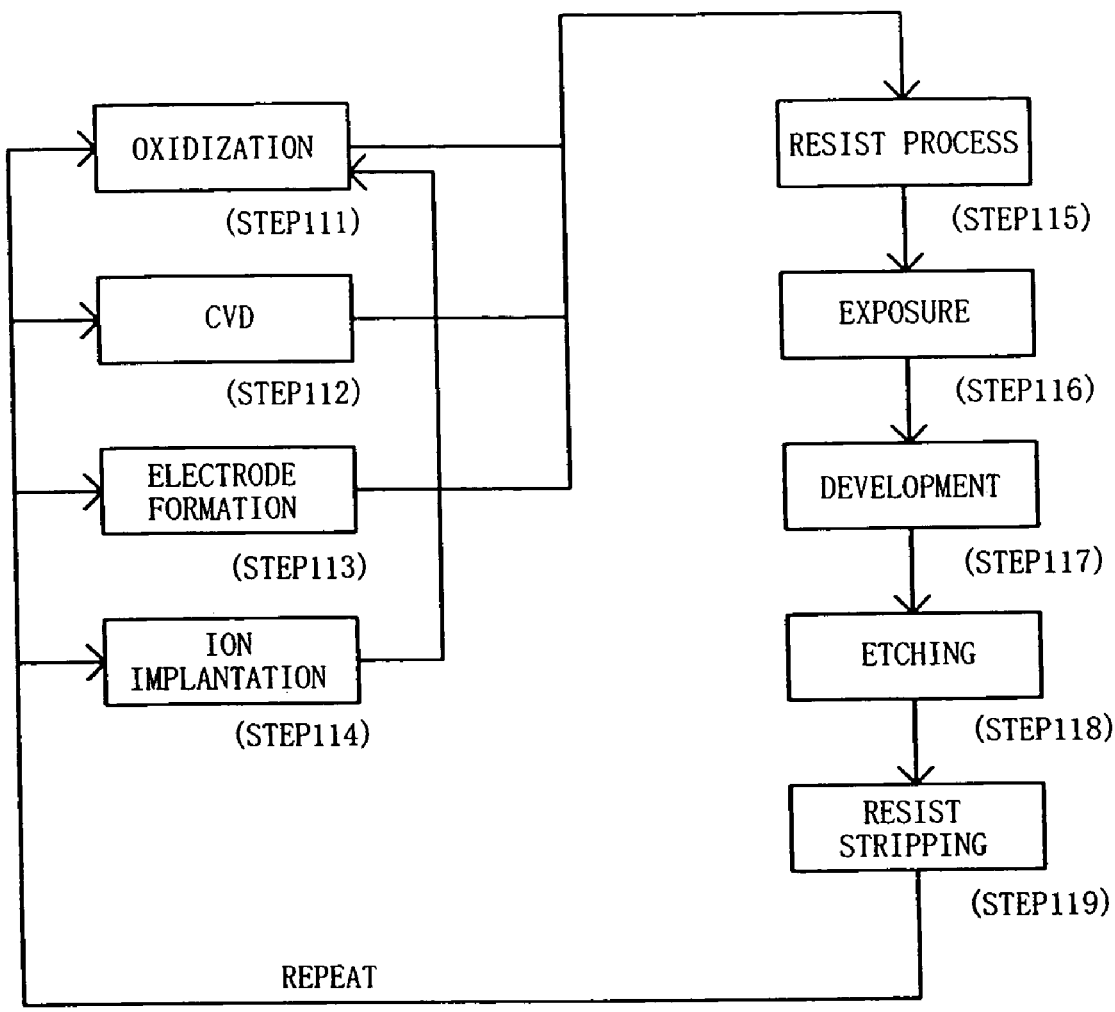
FIG. 12 is a detailed flowchart of the step 104 shown in FIG. 11.

FIG. 12 is a detailed flowchart of the wafer process in step 104. In step 111 (Oxidization), a surface of the wafer is oxidized. In step 112 (CVD), an insulating film is formed on the surface of the wafer. In step 113 (Electrode formation), electrodes are formed by vapor deposition or the like on the wafer. In step 114 (Ion implantation), ions are implanted into the wafer. In step 115 (Resist process), a photosensitive material is coated to the wafer. In step 116 (Exposure), a circuit pattern on the mask is formed on the wafer by exposure. In step 117 (Development), the exposed wafer is developed. In step 118 (Etching), part other than a developed resist image is etched. In step 119 (Resist stripping), the resist disused after etching is removed. These steps are repeatedly followed, and thus overlaid circuit patterns are formed on the wafer. The use of the manufacturing method of the instant embodiments enables the manufacture of high-precision semiconductor devices that was conventionally impossible.

Although the preferred embodiments of the present invention have been described above, various modifications and changes may be made in the present invention without departing from the spirit and scope thereof.

According to the optical element and manufacturing method of the present invention, comparing an embodiment in which the optical axis is made identical with a [1 1 1] axis with another embodiment in which the optical axis is made identical with the [0 0 1] axis kith respect to the intrinsic birefringence, a rate angle in a crystal face at which the intrinsic birefringence represents the maximum value may be greater when the optical axis is made identical with the [0 0 1] axis. Consequently, the optical element using <0 0 1> face. i.e., optical element 100 in which the optical axis is made identical with the [0 0 1] axis may hardly deteriorate image-forming quality under high NA conditions. In addition, when the optical axis is made identical with the [0 0 1] axis, the peak of the intrinsic birefringence is out of the critical angle. This may prevent the birefringence from reaching the peak even under high NA conditions.

Moreover, according to another optical systems of the present invention, which includes at least one optical element having intrinsic birefringence, the birefringence in the optical system for all pencils of light contributing to image forming satisfies b<λ/4, where b denotes wavefront deviation caused by birefringence (unit: nm), and λ denotes a wavelength in use (unit: nm), and thus the optical system may achieve improvement in image-forming qualities.

Further, according to another optical systems of the present invention, although an axis of peaks of the intrinsic birefringence, i.e., the [1 1 0] axis is identical with the optical axis, combination of two parallel flat plates would reduce the intrinsic birefringence in the optical system. Consequently, even such an optical system may achieve improvement in image-forming qualities.

Furthermore, the projection optical system including the inventive optical system, and an exposure apparatus including the inventive optical element, and the exposure apparatus including the projection optical system may provide a high-quality device that is excellent in image-forming quality with good exposure performance such as throughput.

What is claimed is:

1. A projection optical system for projecting a pattern of a mask, said projection optical system comprising plural optical elements, which include an isometric crystal in which an angle between a [0 0 1] axis and an optical axis of the projection optical system is less than 10°,
   wherein the pattern on the mask includes a repetitive pattern and a repetitive direction of the repetitive pattern differs from directions of two axes that are perpendicular to the [0 0 1] axis of the isometric crystal.

2. A projection optical system for projecting a pattern on a mask, said projection optical system comprising a plural optical elements which includes an isometric crystal in which an angle between a [0 0 1] axis and an optical axis of the projection optical system is less than 10°,
   wherein the pattern on the mask includes a repetitive pattern and a repetitive direction of the repetitive pattern forms one of angles of 0°, 45°, and 90° with respect to a primary direction on a plane that includes the mask, and
   wherein directions of two axes that are perpendicular to the [0 0 1] axis of the isometric crystal differ from the primary direction.

3. A projection optical system for projecting a pattern of a mask, said projection optical system comprising a plurality of optical elements made of isometric crystals in which an angle between each [0 0 1] axis of the isometric crystals and an optical axis of the projection optical system is less than 10°,
   wherein the pattern on the mask includes a repetitive pattern and a repetitive direction of the repetitive pattern differs from directions of [1 0 0] and [0 1 0] axes that are perpendicular to the [0 0 1] axis of the isometric crystals.

4. A projection optical system for projecting a pattern on a mask, said projection optical system comprising a plurality of optical elements made of isometric crystals in which an angle between each [0 0 1] axis of the isometric crystals and an optical axis of the projection optical system is less than 10°,
   wherein the pattern on the mask includes a repetitive pattern and a repetitive direction of the repetitive pattern forms one of angles of 0°, 45°, and 90° with respect to a primary direction on a plane that includes the mask, and
   wherein directions of [1 0 0] and [0 1 0] axes that are perpendicular to the [0 0 1] axis of the isometric crystal differ from the repetitive direction.

5. An optical system according to any one of claims 3 or 4, wherein the optical element is one of a lens, a diffraction grating, a parallel flat plate, an optical film, and a combination thereof.

6. An exposure apparatus that uses ultraviolet radiation, deep ultraviolet radiation, or vacuum ultraviolet radiation as exposure light, which is projected onto an object to be processed through the optical system according to claim 5 to expose the object to be processed.

7. A device manufacturing method comprising the steps of: exposing a wafer to a device pattern using the exposure apparatus according to claim 4; and
   developing the exposed wafer.

* * * * *